(12) United States Patent
Leedy

(10) Patent No.: US 7,705,466 B2
(45) Date of Patent: Apr. 27, 2010

(54) THREE DIMENSIONAL MULTI LAYER MEMORY AND CONTROL LOGIC INTEGRATED CIRCUIT STRUCTURE

(75) Inventor: Glenn J Leedy, Saline, MI (US)

(73) Assignee: Elm Technology Corporation, Parkland, FL (US)

( * ) Notice: Subject to any disclaimer, the term of this patent is extended or adjusted under 35 U.S.C. 154(b) by 0 days.

(21) Appl. No.: 10/672,961

(22) Filed: Sep. 26, 2003

(65) Prior Publication Data

US 2004/0070063 A1    Apr. 15, 2004

Related U.S. Application Data

(60) Continuation of application No. 10/379,820, filed on Mar. 3, 2003, which is a division of application No. 10/144,791, filed on May 15, 2002, now Pat. No. 6,563,224, which is a division of application No. 09/607,363, filed on Jun. 30, 2000, now Pat. No. 6,632,706, which is a continuation of application No. 08/971,565, filed on Nov. 17, 1997, now Pat. No. 6,133,640, which is a division of application No. 08/835,190, filed on Apr. 4, 1997, now Pat. No. 5,915,167.

(51) Int. Cl.
*H01L 23/48* (2006.01)
(52) U.S. Cl. .................................... 257/777
(58) Field of Classification Search ................. 257/777, 257/778, 685, 686; 365/200, 201, 230.06, 365/230.6; 438/455, 459, 977, 107, 108
See application file for complete search history.

(56) References Cited

U.S. PATENT DOCUMENTS

| | | | |
|---|---|---|---|
| 2,915,722 A | 12/1959 | Foster | 336/115 |
| 3,202,948 A | 8/1965 | Farrand | 336/115 |
| 3,430,835 A | 3/1969 | Patzer et al. | |
| 3,559,282 A | 2/1971 | Lesk | 438/113 |
| 3,560,364 A | 2/1971 | Burkhardt | 324/207.12 |
| 3,602,982 A | 9/1971 | Emmasingel | 29/577 |
| 3,615,901 A | 10/1971 | Medicus | 148/11.5 R |

(Continued)

FOREIGN PATENT DOCUMENTS

DE    3233195    3/1983

(Continued)

OTHER PUBLICATIONS

Brief Summary Text U.S. Patent No. 5,615,163.*

(Continued)

*Primary Examiner*—Thomas L Dickey
(74) *Attorney, Agent, or Firm*—Useful Arts IP

(57) ABSTRACT

A Three-Dimensional Structure (3DS) Memory allows for physical separation of the memory circuits and the control logic circuit onto different layers such that each layer may be separately optimized. One control logic circuit suffices for several memory circuits, reducing cost. Fabrication of 3DS memory involves thinning of the memory circuit to less than 50 μm in thickness and bonding the circuit to a circuit stack while still in wafer substrate form. Fine-grain high density inter-layer vertical bus connections are used. The 3DS memory manufacturing method enables several performance and physical size efficiencies, and is implemented with established semiconductor processing techniques.

130 Claims, 9 Drawing Sheets

U.S. PATENT DOCUMENTS

| | | | |
|---|---|---|---|
| 3,636,358 A | 1/1972 | Groschwitz | |
| 3,716,429 A | 2/1973 | Napoli et al. | 156/17 |
| 3,777,227 A | 12/1973 | Krishna et al. | 257/578 |
| 3,868,565 A | 2/1975 | Kuipers | 324/207.26 |
| 3,922,705 A | 11/1975 | Yerman | 357/26 |
| 3,932,932 A | 1/1976 | Goodman | |
| 3,997,381 A | 12/1976 | Wanlass | 156/3 |
| 4,028,547 A | 6/1977 | Eisenberger | |
| 4,070,230 A | 1/1978 | Stein | 156/657 |
| 4,131,985 A | 1/1979 | Greenwood et al. | 29/580 |
| 4,142,004 A | 2/1979 | Hauser, Jr. et al. | 438/792 |
| 4,196,232 A | 4/1980 | Schnable et al. | |
| 4,251,909 A | 2/1981 | Hoeberechts | 29/580 |
| 4,262,631 A | 4/1981 | Kubacki | 118/723 MP |
| 4,393,127 A | 7/1983 | Greschner et al. | |
| 4,394,401 A | 7/1983 | Shioya et al. | 427/574 |
| 4,401,986 A | 8/1983 | Trenkler et al. | 340/870.32 |
| 4,416,054 A | 11/1983 | Thomas et al. | 29/572 |
| 4,500,905 A | 2/1985 | Shibata | 357/68 |
| 4,528,072 A | 7/1985 | Kurosawa et al. | |
| 4,539,068 A | 9/1985 | Takagi et al. | 156/614 |
| 4,566,037 A | 1/1986 | Takatsu et al. | |
| 4,585,991 A | 4/1986 | Reid et al. | 324/158 P |
| 4,604,162 A | 8/1986 | Sobczak | |
| 4,612,083 A | 9/1986 | Yasumoto et al. | 156/633 |
| 4,617,160 A | 10/1986 | Belanger et al. | 264/40.1 |
| 4,618,397 A | 10/1986 | Shimizu et al. | 156/628 |
| 4,618,763 A | 10/1986 | Schmitz | 250/211 R |
| 4,622,632 A | 11/1986 | Tanimoto et al. | |
| 4,663,559 A | 5/1987 | Christensen | 313/336 |
| 4,684,436 A | 8/1987 | Burns et al. | 216/65 |
| 4,693,770 A | 9/1987 | Hatada | 156/151 |
| 4,702,336 A | 10/1987 | Seibert et al. | 180/197 |
| 4,702,936 A | 10/1987 | Maeda et al. | 427/583 |
| 4,706,166 A | 11/1987 | Go | 361/403 |
| 4,721,938 A | 1/1988 | Stevenson | 338/4 |
| 4,724,328 A | 2/1988 | Lischke | |
| 4,761,681 A | 8/1988 | Reid | 357/68 |
| 4,784,721 A | 11/1988 | Holmen et al. | 156/647 |
| 4,810,673 A | 3/1989 | Freeman | 438/386 |
| 4,810,889 A | 3/1989 | Yokomatsu et al. | |
| 4,825,277 A | 4/1989 | Mattox et al. | 257/639 |
| 4,835,765 A | 5/1989 | Bergmans et al. | |
| 4,849,857 A | 7/1989 | Butt et al. | |
| 4,857,481 A | 8/1989 | Tam et al. | 438/619 |
| 4,892,753 A | 1/1990 | Wang et al. | 427/579 |
| 4,897,708 A | 1/1990 | Clements | 257/690 |
| 4,919,749 A | 4/1990 | Mauger et al. | |
| 4,924,589 A | 5/1990 | Leedy | 438/6 |
| 4,928,058 A | 5/1990 | Williamson | |
| 4,934,799 A | 6/1990 | Chu | |
| 4,939,568 A | 7/1990 | Kato et al. | 357/75 |
| 4,940,916 A | 7/1990 | Borel et al. | 313/306 |
| 4,950,987 A | 8/1990 | Vranish et al. | 324/207.23 |
| 4,952,446 A | 8/1990 | Lee et al. | 428/220 |
| 4,954,865 A | 9/1990 | Rokos | 257/378 |
| 4,954,875 A | 9/1990 | Clements | |
| 4,957,882 A | 9/1990 | Shinomiya | 438/65 |
| 4,965,415 A | 10/1990 | Young et al. | 200/83 N |
| 4,966,663 A | 10/1990 | Mauger | 205/656 |
| 4,983,251 A | 1/1991 | Haisma et al. | 438/3 |
| 4,990,462 A | 2/1991 | Sliwa | |
| 4,994,336 A | 2/1991 | Benecke et al. | |
| 4,994,735 A | 2/1991 | Leedy | 324/158 |
| 5,000,113 A | 3/1991 | Wang et al. | 118/723 |
| 5,008,619 A | 4/1991 | Keogh et al. | 324/207.17 |
| 5,010,024 A | 4/1991 | Allen et al. | 438/659 |
| 5,020,219 A | 6/1991 | Leedy | 29/846 |
| 5,034,685 A | 7/1991 | Leedy | 324/158 F |
| 5,051,326 A | 9/1991 | Celler et al. | |
| 5,062,689 A | 11/1991 | Koehler | |
| 5,070,026 A | 12/1991 | Greenwald et al. | 437/3 |
| 5,071,510 A | 12/1991 | Findler et al. | 156/647 |
| 5,098,865 A | 3/1992 | Machado et al. | 438/788 |
| 5,103,557 A | 4/1992 | Leedy | 29/832 |
| 5,110,373 A | 5/1992 | Mauger | 148/33.2 |
| 5,110,712 A | 5/1992 | Kessler et al. | |
| 5,111,278 A | 5/1992 | Eichelberger | 357/75 |
| 5,116,777 A | 5/1992 | Chan et al. | 438/234 |
| 5,117,282 A | 5/1992 | Salatino | |
| 5,119,164 A | 6/1992 | Sliwa et al. | |
| 5,130,894 A | 7/1992 | Miller | 361/393 |
| 5,132,244 A | 7/1992 | Roy | 438/477 |
| 5,144,142 A | 9/1992 | Fueki et al. | |
| 5,151,775 A | 9/1992 | Hadwin | 357/80 |
| 5,156,909 A | 10/1992 | Henager, Jr. et al. | 428/334 |
| 5,166,962 A | 11/1992 | Murooka et al. | |
| 5,169,805 A | 12/1992 | Mok et al. | |
| 5,188,706 A | 2/1993 | Hori et al. | |
| 5,203,731 A | 4/1993 | Zimmerman | 445/24 |
| 5,225,771 A | 7/1993 | Leedy | 324/158 |
| 5,236,118 A | 8/1993 | Bower et al. | 228/193 |
| 5,240,458 A | 8/1993 | Linglain et al. | 464/63 |
| 5,245,227 A | 9/1993 | Furtek et al. | |
| 5,259,247 A | 11/1993 | Bantien | 73/718 |
| 5,262,341 A | 11/1993 | Fueki et al. | |
| 5,262,351 A | 11/1993 | Bureau et al. | 437/183 |
| 5,270,261 A | 12/1993 | Bertin et al. | 437/209 |
| 5,273,940 A | 12/1993 | Sanders | 437/209 |
| 5,274,270 A | 12/1993 | Tuckerman | 257/758 |
| 5,279,865 A | 1/1994 | Chebi et al. | 427/574 |
| 5,283,107 A | 2/1994 | Bayer et al. | |
| 5,284,796 A | 2/1994 | Nakanishi et al. | 437/183 |
| 5,284,804 A | 2/1994 | Moslehi | |
| 5,293,457 A | 3/1994 | Arima et al. | |
| 5,323,035 A | 6/1994 | Leedy | 257/48 |
| 5,324,687 A | 6/1994 | Wojnarowski | 437/225 |
| 5,354,695 A * | 10/1994 | Leedy | 438/411 |
| 5,358,909 A | 10/1994 | Hashiguchi et al. | |
| 5,363,021 A | 11/1994 | MacDonald | 315/366 |
| 5,385,632 A | 1/1995 | Goossen | 156/630 |
| 5,385,909 A | 1/1995 | Nelson et al. | 514/291 |
| 5,399,505 A | 3/1995 | Dasse et al. | |
| RE34,893 E | 4/1995 | Fujii et al. | 257/419 |
| 5,420,458 A | 5/1995 | Shimoji | 257/622 |
| 5,424,920 A | 6/1995 | Miyake | 361/735 |
| 5,426,072 A | 6/1995 | Finnila | 437/208 |
| 5,426,363 A | 6/1995 | Akagi et al. | 324/239 |
| 5,432,444 A | 7/1995 | Yasohama et al. | 324/240 |
| 5,432,729 A | 7/1995 | Carson et al. | 365/63 |
| 5,432,999 A | 7/1995 | Capps et al. | |
| 5,434,500 A | 7/1995 | Hauck et al. | 324/67 |
| 5,450,603 A | 9/1995 | Davies | |
| 5,451,489 A | 9/1995 | Leedy | 430/313 |
| 5,453,404 A | 9/1995 | Leedy | 437/203 |
| 5,457,879 A | 10/1995 | Gurtler et al. | 29/895 |
| 5,463,246 A * | 10/1995 | Matsunami | 257/621 |
| 5,470,693 A | 11/1995 | Sachdev et al. | |
| 5,476,813 A | 12/1995 | Naruse | 437/132 |
| 5,480,842 A | 1/1996 | Clifton et al. | |
| 5,481,133 A | 1/1996 | Hsu | |
| 5,489,554 A | 2/1996 | Gates | 437/208 |
| 5,502,667 A | 3/1996 | Bertin et al. | 365/51 |
| 5,512,397 A | 4/1996 | Leedy | 430/30 |
| 5,514,628 A | 5/1996 | Enomoto et al. | |
| 5,517,457 A | 5/1996 | Sakui et al. | |
| 5,527,645 A | 6/1996 | Pati et al. | 430/5 |
| 5,529,829 A | 6/1996 | Koskenmaki et al. | 428/167 |
| 5,534,465 A | 7/1996 | Frye et al. | 437/209 |
| 5,555,212 A | 9/1996 | Toshiaki et al. | 365/200 |
| 5,563,084 A | 10/1996 | Ramm et al. | 437/51 |
| 5,571,741 A | 11/1996 | Leedy | 437/51 |
| 5,572,689 A | 11/1996 | Gallup et al. | |
| 5,577,050 A | 11/1996 | Bair et al. | |

| | | | |
|---|---|---|---|
| 5,580,687 A | 12/1996 | Leedy | 430/5 |
| 5,581,498 A | 12/1996 | Ludwig et al. | 365/63 |
| 5,582,939 A | 12/1996 | Pierrat | 430/5 |
| 5,583,688 A | 12/1996 | Hornbeck | 359/291 |
| 5,592,007 A | 1/1997 | Leedy | 257/347 |
| 5,592,018 A | 1/1997 | Leedy | 257/619 |
| 5,595,933 A | 1/1997 | Heijboer | 439/20 |
| 5,606,186 A | 2/1997 | Noda | 257/226 |
| 5,615,163 A * | 3/1997 | Sakui et al. | 365/230.03 |
| 5,620,915 A | 4/1997 | Chen et al. | |
| 5,626,137 A | 5/1997 | Dumoulin et al. | 430/313 |
| 5,627,112 A | 5/1997 | Tennant et al. | 438/113 |
| 5,629,137 A | 5/1997 | Leedy | 430/313 |
| 5,633,209 A | 5/1997 | Leedy | 435/228 |
| 5,637,536 A | 6/1997 | Val | 438/686 |
| 5,637,907 A | 6/1997 | Leedy | |
| 5,654,127 A | 8/1997 | Leedy | 430/315 |
| 5,654,220 A | 8/1997 | Leedy | 438/25 |
| 5,656,552 A | 8/1997 | Hudak et al. | 438/15 |
| 5,675,185 A | 10/1997 | Chen et al. | 257/774 |
| 5,694,588 A | 12/1997 | Ohara et al. | 395/566 |
| 5,725,995 A | 3/1998 | Leedy | 430/315 |
| 5,733,814 A | 3/1998 | Flesher et al. | |
| 5,745,673 A | 4/1998 | Di Zenzo et al. | |
| 5,750,211 A | 5/1998 | Weise et al. | 427/579 |
| 5,753,536 A * | 5/1998 | Sugiyama et al. | 438/108 |
| 5,760,478 A | 6/1998 | Bozso et al. | 257/777 |
| 5,773,152 A | 6/1998 | Okonogi | 428/446 |
| 5,786,116 A | 7/1998 | Rolfson | 430/5 |
| 5,786,629 A * | 7/1998 | Faris | 257/686 |
| 5,787,445 A * | 7/1998 | Daberko | 707/205 |
| 5,793,115 A | 8/1998 | Zavracky et al. | 257/777 |
| 5,818,748 A | 10/1998 | Bertin et al. | |
| 5,831,280 A | 11/1998 | Ray | 257/48 |
| 5,834,334 A | 11/1998 | Leedy | 438/107 |
| 5,840,593 A | 11/1998 | Leedy | 438/6 |
| 5,856,695 A | 1/1999 | Ito et al. | 257/370 |
| 5,868,949 A | 2/1999 | Sotokawa et al. | 216/18 |
| 5,869,354 A | 2/1999 | Leedy | 438/110 |
| 5,870,176 A | 2/1999 | Sweatt et al. | 355/53 |
| 5,880,010 A | 3/1999 | Davidson | 438/455 |
| 5,882,532 A | 3/1999 | Field et al. | 216/2 |
| 5,902,118 A * | 5/1999 | Hubner | 438/106 |
| 5,915,167 A | 6/1999 | Leedy | 438/108 |
| 5,946,559 A | 8/1999 | Leedy | 438/157 |
| 5,985,693 A | 11/1999 | Leedy | 438/107 |
| 5,998,069 A | 12/1999 | Cutter et al. | 430/5 |
| 6,008,126 A | 12/1999 | Leedy | 438/667 |
| 6,017,658 A | 1/2000 | Rhee et al. | |
| 6,020,257 A | 2/2000 | Leedy | 438/626 |
| RE36,623 E | 3/2000 | Wang et al. | 427/579 |
| 6,045,625 A | 4/2000 | Houston | 148/33.3 |
| 6,084,284 A | 7/2000 | Adamic, Jr. | 257/506 |
| 6,087,284 A | 7/2000 | Brix et al. | 501/69 |
| 6,092,174 A | 7/2000 | Roussakov | |
| 6,097,096 A | 8/2000 | Gardner et al. | 257/777 |
| 6,133,640 A | 10/2000 | Leedy | 257/778 |
| 6,154,809 A | 11/2000 | Ikenaga et al. | |
| 6,194,245 B1 | 2/2001 | Tayanaka | 438/57 |
| 6,197,456 B1 | 3/2001 | Aleshin et al. | 430/5 |
| 6,208,545 B1 | 3/2001 | Leedy | 365/51 |
| 6,230,233 B1 | 5/2001 | Lofgren | |
| 6,236,602 B1 | 5/2001 | Patti | 365/201 |
| 6,261,728 B1 | 7/2001 | Lin | 430/30 |
| 6,288,561 B1 | 9/2001 | Leedy | 324/760 |
| 6,294,909 B1 | 9/2001 | Leedy | 324/207.17 |
| 6,300,935 B1 | 10/2001 | Sobel et al. | |
| 6,301,653 B1 | 10/2001 | Mohamed et al. | |
| 6,320,593 B1 | 11/2001 | Sobel et al. | |
| 6,355,976 B1 | 3/2002 | Faris | |
| RE37,637 E | 4/2002 | Clifton et al. | |
| 6,445,006 B1 | 9/2002 | Brandes et al. | |
| 6,518,073 B2 | 2/2003 | Momohara | 438/4 |
| 6,563,224 B2 * | 5/2003 | Leedy | 257/778 |
| 6,682,981 B2 | 1/2004 | Leedy | |
| 6,713,327 B2 | 3/2004 | Leedy | |
| 6,714,625 B1 | 3/2004 | Leedy | |
| 6,765,279 B2 | 7/2004 | Leedy | |
| 6,838,896 B2 | 1/2005 | Leedy | |
| 6,891,387 B2 | 5/2005 | Leedy | |
| 6,894,392 B1 | 5/2005 | Gudesen et al. | |
| 2003/0218182 A1 | 11/2003 | Leedy | |
| 2003/0223535 A1 | 12/2003 | Leedy | |
| 2005/0023656 A1 | 2/2005 | Leedy | |

FOREIGN PATENT DOCUMENTS

| | | |
|---|---|---|
| EP | 0 189 976 | 8/1986 |
| EP | 0 201 380 B1 | 12/1986 |
| EP | 0 224 418 B1 | 6/1987 |
| EP | 0 238 089 A2 | 9/1987 |
| EP | 0238089 | 9/1987 |
| EP | 0 314 437 | 5/1989 |
| EP | 0 419 898 B1 | 4/1991 |
| EP | 0 455 455 B1 | 11/1991 |
| EP | 0 487 302 B1 | 5/1992 |
| EP | 0 503 816 B1 | 9/1992 |
| EP | 0 518 283 | 12/1992 |
| EP | 0 518 774 B1 | 12/1992 |
| EP | 0518283 | 12/1992 |
| EP | 0 526 551 B1 | 2/1993 |
| EP | 0 554 063 B1 | 8/1993 |
| EP | 0 555 252 B1 | 8/1993 |
| EP | 0 703 618 A1 | 3/1996 |
| EP | 0 703 619 A1 | 3/1996 |
| EP | 0703618 | 3/1996 |
| EP | 0703619 | 3/1996 |
| EP | 0 731 525 | 9/1996 |
| FR | 2641129 | 12/1988 |
| GB | 2125168 | 2/1984 |
| GB | 2215168 | 9/1989 |
| JP | 60-74643 | 4/1985 |
| JP | 60126871 | 7/1985 |
| JP | S60-126871 | 7/1985 |
| JP | 61-30059 A | 2/1986 |
| JP | 62-272556 A | 11/1987 |
| JP | S63-076484 | 4/1988 |
| JP | S63-229862 | 9/1988 |
| JP | 01-157561 A | 6/1989 |
| JP | 402027600 A | 1/1990 |
| JP | 402027600 A | 1/1990 |
| JP | 02-037655 | 2/1990 |
| JP | 2037655 | 2/1990 |
| JP | 02-082564 | 3/1990 |
| JP | 03-127816 | 5/1991 |
| JP | 3127816 | 5/1991 |
| JP | 03-174715 | 7/1991 |
| JP | 3174715 | 7/1991 |
| JP | 04-042957 | 2/1992 |
| JP | 04-076946 | 3/1992 |
| JP | 04-083371 | 3/1992 |
| JP | 04-107964 | 4/1992 |
| JP | 04-196263 | 7/1992 |
| JP | 05-109977 | 4/1993 |
| JP | 05-283607 A | 10/1993 |
| JP | 08017962 * | 1/1996 |
| JP | 08-504060 A | 4/1996 |
| JP | 09-152979 A | 6/1997 |
| JP | 09152979 | 6/1997 |
| JP | 10-107065 | 4/1998 |
| JP | 10-209371 A | 8/1998 |
| WO | WO 89 10255 | 11/1989 |
| WO | WO 90 09093 | 8/1990 |
| WO | WO9105366 | 4/1991 |
| WO | WO 92/03848 | 3/1992 |
| WO | WO 92 17901 | 10/1992 |

| WO | WO 98/19337 | 5/1998 |
| WO | WO 01/05366 | 1/2001 |
| WO | WO 03/078305 | 9/2003 |
| WO | WO03078305 | 9/2003 |

OTHER PUBLICATIONS

Aboaf, J.A., "Stresses in $SiO_2$ Films Obtained from the Thermal Decomposition of Tetraethylorthosilicate—Effect of Heat Treatment and Humidity," J. Electrochem. Soc.: Solid State Science; 116(12): 1732-1736 (Dec. 1969).

Scheuerman, R.J., "Fabrication of Thin Dielectric Films with Low Internal Stresses," J. Vac. Sci. and Tech., 7(1): 143-146 (1970).

Bailey, R., "Glass for Solid-State Devices: Glass film has low intrinsic compressive stress for isolating active layers of magnetic-bubble and other solid-state devices," NASA Tech Brief (1982).

Alloert, K., et al., "A Comparison Between Silicon Nitride Films Made by PCVD of $N_2$-$SiH_4$ /Ar and $N_2$-$SiH_4$/He," Journal of the Electrochemical Society, vol. 132, No. 7, pp. 1763-1766, (Jul. 1985).

Nguyen, S.V., Plasma Assisted Chemical Vapor Deposited Thin Films for Microelectronic Applications, J. Vac. Sci. Technol. vol. B4, No. 5, pp. 1159-1167, (Sep./Oct. 1986).

Wolf, Stanley, "Basics of Thin Films," Silicon Processing for the VLSI Era, pp. 115, 192, 193, and 199 (1986).

Knolle, W.R., et al., "Characterization of Oxygen-Doped, Plasma-Deposited Silicon Nitride," Journal of the Electrochemical Society, vol. 135, No. 5, pp. 1211-1217, (May 1988).

Olmer, et al., "Intermetal Dielectric Deposition by Plasma Enhanced Chemical Vapor Deposition," Fifth IEEE/CHMT International Electronic Manufacturing Technology Symposium—Design-to-Manufacturing Transfer Cycle, pp. 98-99 (1988).

"Partitioning Function and Packaging of Integrated Circuits for Physical Security of Data," IBM Technical Disclosure Bulletin, IBM Corp., 32(1):46-49 (Jun. 1989).

Hsieh, et al., "Directional Deposition of Dielectric Silicon Oxide by Plasma Enhanced TEOS Process," 1989 Proceedings, Sixth International IEEE VLSI Multilevel Interconnection Conference, pp. 411-415 (1989).

Runyan,W.R., "Deposition of Inorganic Thin Films," Semiconductor Integrated Circuit Processing Technology, p. 142 (1990).

Hendricks, et al., "Polyquinoline Coatings and Films: Improved Organic Dielectrics for IC's and MCM's," Eleventh IEEE/CHMT International Electronics Manufacturing Technology Symposium, pp. 361-265 (1991).

Tessier, et al., "An Overview of Dielectric Materials for Multichip Modules," SPE, Electrical & Electronic Div., (6):260-269 (1991).

Treichel, et al., "Planarized Low-Stress Oxide/Nitride Passivation for ULSI Devices," J. Phys IV, Colloq. (France), 1 (C2): 839-846 (1991).

Vossen, John L., "Plasma-Enhanced Chemical Vapor Deposition," Thin Film Processes II, pp. 536-541 (1991).

Sze, S.M., "Surface Micromachining," Semiconductor Sensors, pp. 58-63 (1994).

Krishnamoorthy, et al., "3-D Integration of MQW Modulators Over Active Submicron CMOS Circuits: 375 Mb/s Transimpedance Receiver—Transmitter Circuit," IEEE Photonics Technology Letters, 2(11): 1288-1290 (Nov. 1995).

Tielert et al., "Benefits of Vertically Stacked Integrated Circuits for Sequential Logic," IEEE, XP-000704550, 121-124 (Dec. 5, 1996).

"IC Tower Patent: Simple Technology Receives Patent on the IC Tower, a Stacked Memory Technology," http://www.simpletech.com/whatsnew/memory/@60824.htm (1998).

"Miniature Electron Microscopes Without Vacuum Pumps, Self-Contained, Microfabricated Devices with Short Working Distances, Enable Operation in Air," NASA Tech Briefs, 39-40 (1998).

Jones, R.E., Jr. "An evaluation of methods for passivating silicon integrated circuits"; Apr. 1972; pp. 23-28.

Sun, R.C.; Tisone, T.C.; Cruzan, P.D.; "Internal stresses and resistivity of low-voltage sputtered tungsten films (microelectronic cct. conductor)"; Mar. 1973; pp. 1009-1016.

Wade, T.E.; "Low temperature double-exposed polyimide/oxide dielectric for VLSI multilevel metal interconnection"; 1982; pp. 516-519.

Boyer, P.K.; Collins, G.J.; Moore, C.A.; Ritchie, W.K.; Roche, G. A.; Solanski, R. (A); Tang, C.C.; "Microelectronic thin film deposition by ultraviolet laser photolysis Monograph Title—Laser processing of semiconductor devices"; 1983; pp. 120-126.

Boyer, P.K.; Moore, C.A.; Solanki, R.; Ritchie, W.K.; Roche, G.A.; Collins, G.J.; "Laser photolytic deposition of thin films"; 1983; pp. 119-127.

Chen, Y.S.; Fatemi, H.; "Stress measurements on multilevel thin film dielectric layers used in Si integrated circuits"; May-Jun. 1986; pp. 645-649.

Townsend, P.H.; Huggins, R.A.; "Stresses in borophosphosilicate glass films during thermal cycling"; Oct. 21-22, 1986; pp. 134-141.

Pai, Pei-Lin; "Multilevel Interconnection Technologies—A Framework and Examples"; 1987; pp. 1871.

Pei-lin Pai; Chetty, A.; Roat, R.; Cox, N.; Chiu Ting; "Material characteristics of spin-on glasses for interlayer dielectric applications"; Nov. 1987, pp. 2829-2834.

Chang, E.Y.; Cibuzar, G.T.; Pande, K.P.; "Passivation of GaAs FET's with PECVD silicon nitride films of different stress states"; Sep. 1988; pp. 1412-1418.

Riley, P.E.; Shelley, A.; "Characterization of a spin-applied dielectric for use in multilevel metallization"; May 1988; pp. 1207-1210.

Tamura, H.; Nishikawa, T.; Wakino, K.; Sudo, T.; "Metalized MIC substrates using high K dielectric resonator materials"; Oct. 1988; pp. 117-126.

Reche, J.J. H.; "Control of thin film materials properties used in high density multichip interconnect"; Apr. 24-28, 1989; p. 494.

Maw, T.; Hopla, R.E.; "Properties of a photoimageable thin polyimide film"; Nov. 26-29, 1990; pp. 71-76.

Draper, B. L.; Hill, T.A.; "Stress and stress relaxation in integrated circuit metals and dielectrics"; Jul.-Aug. 1991; pp. 1956-1962.

Guckel, H.; "Surface micromachined pressure transducers"; 1991; pp. 133-146.

Garino, T.J.; Harrington, H. M.; Residual stress in PZT thin films and its effect on ferroelectric properties'; 1992; pp. 341-347.

Wolf, Stanley and Richard N. Tauber; Silicon Processing for the VLSI Era, vol. 1: Process Technology; Sunset Beach, CA: Lattice Press, 1986, pp. 191-194.

S. Wolf, Silicon Processing for the VLSI Era, 1990, Lattice Press, vol. 2, p. 191.

Svechnikov, S.V.; Kobylyatskaya, M.F.; Kimarskii, V.I.; Kaufman, A.P.; Kuzolev, Yu. I.; Cherepov, Ye. I.; Fomin, B.I.; "Switching Card With Aluminum Membrane Current Lead Crossovers";1972.

Salazar, M.; Wilkins, C.W., Jr.; Ryan, V.W.; Wang, T.T.; "Low stress films of cyclized polybutadiene dielectrics by vacuum annealing"; Oct. 21-22, 1986; pp. 96-102.

Kochugova, I.V.; Nikolaeva, L.V.; Vakser, N.M., (M.I. Kalinin Leningrad Polytechnic Institute (USSR); "Electrophysical investigation of thin-layered inorganic coatings"; 1989; pp. 826-828.

S. Wolf, Silicon Processing, 1990, Lattice Press, vol. 2, p. 111.

Wolf, Stanley and Richard N. Tauber; Silicon Procesing for the VLSI Era, vol. 1: Process Technology; Sunset Beach, CA: Lattice Press, 1986, pp. 191-194.

S. Wolf, Silicon Processing for the VLSI Era, 1990, Lattice Press, vol. 2, p. 191.

"Christensens Physics of Diagnostic Radiology," Currey et al., pp. 29-33, 1990.

Mitsumasa Koyanagi et al.; "Design of 4-DBIT X 4-layer Optically Coupled Three-Dimensional Common Memory for Parallel Processor System," IEEE Journal of Solid-State Circuits, vol. 25, No. 1, Feb. 1, 1990.

Sung et al., "Well-aligned carbon nitride nanotubes synthesized in anodic alumina by electron cyclotron resonance chemical vapor deposition," Applied Physics Letters, vol. 74, No. 2, 197, 1999, Jan. 11, 1999.

"IC Tower Patent: Simple Technology Receives Patent on the IC Tower, a Stacked Memory Technology," http://www.simpletech.com/whatsnew/memory/@60824.htm (1998).

Alloert, K., et al., "A Comparison Between Silicon Nitride Films Made by PCVD of $N_2$-$SiH_4$ /Ar and $N_2$-$SiH_4$/He," Journal of the Electrochemical Society, vol. 132, No. 7, pp. 1763-1766, (Jul. 1985).

Hendricks, et al., "Polyquinoline Coatings and Films: Improved Organic Dielectrics for IC's and MCM's," *Eleventh IEEE/CHMT International Electronics Manufacturing Technology Symposium*, pp. 361-265 (1991).

Knolle, W.R., et al., "Characterization of Oxygen-Doped, Plasma-Deposited Silicon Nitride," *Journal of the Electrochemical Society*, vol. 135, No. 5, pp. 1211-1217, (May 1988).

Nguyen, S.V., Plasma Assisted Chemical Vapor Deposited Thin Films for Microelectronic Applications, *J. Vac. Sci. Technol.* vol. B4, No. 5, pp. 1159-1167, (Sep./Oct. 1986).

Olmer, et al., "Intermetal Dielectric Deposition by Plasma Enhanced Chemical Vapor Deposition," *Fifth IEEE/CHMT International Electronic Manufacturing Technology Symposium—Design-to-Manufacturing Transfer Cycle*, pp. 98-99 (1988).

Runyan, W.R., "Deposition of Inorganic Thin Films," *Semiconductor Integrated Circuit Processing Technology*, p. 142 (1990).

Sze, S.M., "Surface Micromachining," *Semiconductor Sensors*, pp. 58-63 (1994).

Vossen, John L., "Plasma-Enhanced Chemical Vapor Deposition," *Thin Film Processes II*, pp. 536-541 (1991).

Wolf, Stanley, "Basics of Thin Films," *Silicon Processing for the VLSI Era*, pp. 115, 192, 193, and 199 (1986).

"Christensens Physics of Diagnostic Radiology," Curry et al., pp. 29-33, 1990.

Sung, et al., "Well-aligned carbon nitride nanotubes synthesized in anodic alumina by electron cyclotron resonance chemical vapor deposition," Applied Physics Letters, vol. 74, No. 2, 197, 1999, Jan. 11, 1999.

Phys. Rev., B., Condens, Matter Mater. Phys. (USA), Physical Review B (Condensed Matter and Materials Physics), Mar. 15, 2003, APS through AIP, USA.

Mitsumasa Koyanagi et al., "Design of 4-Kbit X 4-layer Optically Coupled Three-Dimensional Common Memory for Parallel Processor System," IEEE Journal of Solid-State Circuits, vol. 25. No. 1, Feb. 1, 1990.

\* cited by examiner

THREE DIMENSIONAL MULTI LAYER MEMORY AND CONTROL LOGIC INTEGRATED CIRCUIT STRUCTURE

CROSS REFERENCE TO RELATED APPLICATIONS

This application is a continuation of, commonly assigned U.S. patent application Ser. No. 10/379,820, filed Mar. 3, 2003, which is a division of U.S. patent application Ser. No. 10/144,791, filed May 15, 2002, now U.S. Pat. No. 6,563,224, which is a division of U.S. patent application Ser. No. 09/607,363, filed Jun. 30, 2000, which is a continuation of U.S. patent application Ser. No. 08/971,565, filed Nov. 17, 1997, now U.S. patent Ser. No. 6,133,640, which is a division of U.S. patent application Ser. No. 08/835,190, filed Apr. 4, 1997, now U.S. Pat. No. 5,915,167, all of which are incorporated by reference herein in their entireties.

BACKGROUND OF THE INVENTION

1. Field of the Invention

The present invention relates to stacked integrated circuit memory.

2. State of the Art

Manufacturing methods for increasing the performance and decreasing the cost of electronic circuits, nearly without exception, are methods that increase the integration of the circuit and decrease its physical size per equivalent number of circuit devices such as transistors or capacitors. These methods have produced as of 1996 microprocessors capable of over 100 million operations per second that cost less than $1,000 and 64 Mbit DRAM circuits that access data in less than 50 ns and cost less than $50. The physical size of such circuits is less than 2 cm$^2$. Such manufacturing methods support to a large degree the economic standard of living in the major industrialized countries and will most certainly continue to have significant consequences in the daily lives of people all over the world.

Circuit manufacturing methods take two primary forms: process integration and assembly integration. Historically the line between these two manufacturing disciplines has been clear, but recently with the rise in the use of MCMs (Multi-Chip Modules) and flip-chip die attach, this clear separation may soon disappear. (The predominate use of the term Integrated Circuit (IC) herein is in reference to an Integrated Circuit in singulated die form as sawed from a circuit substrate such as s semiconductor wafer versus, for example, an Integrated Circuit in packaged form.) The majority of ICs when in initial die form are presently individually packaged, however, there is an increasing use of MCMs. Die in an MCM are normally attached to a circuit substrate in a planar fashion with conventional IC die I/O interconnect bonding methods such as wire bonding, DCA (Direct Chip Attach) or FCA (Flip-Chip Attach).

Integrated circuit memory such as DRAM, SRAM, flash EPROM, EEPROM, Ferroelectric, GMR (Giant MagnetoResistance), etc. have the common architectural or structural characteristic of being monolithic with the control circuitry integrated on the same die with the memory array circuitry. This established (standard or conventional) architecture or circuit layout structure creates a design trade-off constraint between control circuitry and memory array circuitry for large memory circuits. Reductions in the fabrication geometries of memory cell circuitry has resulted in denser and denser memory ICs, however, these higher memory densities have resulted in more sophisticated control circuitry at the expense of increased area of the IC. Increased IC area means at least higher fabrication costs per IC (fewer ICs per wafer) and lower IC yields (fewer working ICs per wafer), and in the worst case, an IC design that cannot be manufactured due to its non-competitive cost or unreliable operation.

As memory density increases and the individual memory cell size decreases more control circuitry is required. The control circuitry of a memory IC as a percentage of IC area in some cases such as DRAMs approaches or exceeds 40%. One portion of the control circuitry is the sense amp which senses the state, potential or charge of a memory cell in the memory array circuitry during a read operation. The sense amp circuitry is a significant portion of the control circuitry and it is a constant challenge to the IC memory designer to improve sense amp sensitivity in order to sense ever smaller memory cells while preventing the area used by the sense amp from becoming too large.

If this design constraint or trade-off between control and memory circuits did not exist, the control circuitry could be made to perform numerous additional functions, such as sensing multiple storage states per memory cell, faster memory access through larger more sensitive sense amps, caching, refresh, address translation, etc. But this trade-off is the physical and economic reality for memory ICs as they are presently made by all manufacturers.

The capacity of DRAM circuits increase by a factor of four from one generation to the next; e.g. 1 Mbit, 4 Mbit, 16 Mbit and 64 Mbit DRAMs. This four times increase in circuit memory capacity per generation has resulted in larger and larger DRAM circuit areas. Upon introduction of a new DRAM generation the circuit yields are too low and, therefore, not cost effective for high volume manufacture. It is normally several years between the date prototype samples of a new DRAM generation are shown and the date such circuits are in volume production.

Assembling die in a stacked or three dimensional (3D) manner is disclosed in U.S. Pat. No. 5,354,695 of the present inventor, incorporated herein by reference. Furthermore, assembling die in a 3D manner has been attempted with regard to memory. Texas Instruments of Dallas Tex., Irvine Sensors of Costa Mesa Calif. and Cubic Memory Corporation of Scotts Valley Calif., have all attempted to produce stacked or 3D DRAM products. In all three cases, conventional DRAM circuits in die form were stacked and the interconnect between each DRAM in the stack was formed along the outside surface of the circuit stack. These products have been available for the past several years and have proved to be too expensive for commercial applications, but have found some use in space and military applications due to their small physical size or footprint.

The DRAM circuit type is referred to and often used as an example in this specification, however, this invention is clearly not limited to the DRAM type of circuit. Undoubtedly memory cell types such as EEPROMs (Elecurically Erasable Programmable Read Only Memories), flash EPROM, Ferroelectric, or combinations (intra or inter) of such memory cells can also be used with the present Three Dimensional Structure (3DS) methods to form 3DS memory devices.

The present invention furthers, among others, the following objectives:

1. Several-fold lower fabrication cost per megabyte of memory than circuits conventionally made solely with monolithic circuit integration methods.

2. Several-fold higher performance than conventionally made memory circuits.

3. Many-fold higher memory density per IC than conventionally made memory circuits.

4. Greater designer control of circuit area size, and therefore, cost.

5. Circuit dynamic and static self-test of memory cells by an internal controller.

6. Dynamic error recovery and reconfiguration.

7. Multi-level storage per memory cell.

8. Virtual address translation, address windowing, various address functions such as indirect addressing or content addressing, analog circuit functions and various graphics acceleration and microprocessor functions.

SUMMARY OF THE INVENTION

The present 3DS memory technology is a stacked or 3D circuit assembly technology. Features include:

1. Physical separation of the memory circuits and the control logic circuit onto different layers;

2. The use of one control logic circuit for several memory circuits;

3. Thinning of the memory circuit to less than about 50 µm in thickness forming a substantially flexible substrate with planar processed bond surfaces and bonding the circuit to the circuit stack while still in wafer substrate form; and 4. The use of fine-grain high density inter layer vertical bus connections.

The 3DS memory manufacturing method enables several performance and physical size efficiencies, and is implemented with established semiconductor processing techniques. Using the DRAM circuit as an example, a 64 Mbit DRAM made with a 0.25 µm process could have a die size of 84 mm², a memory area to die size ratio of 40% and a access time of about 50 ns for 8 Mbytes of storage; a 3DS DRAM IC made with the same 0.25 µm process would have a die size of 18.6 mm², use 17 DRAM array circuit layers, a memory area to die size ratio of 94.4% and an expected access time of less than 10 ns for 64 Mbytes of storage. The 3DS DRAM IC manufacturing method represents a scalable, many-fold reduction in the cost per megabyte versus that of conventional DRAM IC manufacturing methods. In other words, the 3DS memory manufacturing method represents, at the infrastructure level, a fundamental cost savings that is independent of the process fabrication technology used.

BRIEF DESCRIPTION OF THE DRAWING

The present invention may be further understood from the following description in conjunction with the appended drawing. In the drawing.

DETAILED DESCRIPTION OF THE PREFERRED EMBODIMENTS

Figure 1A:
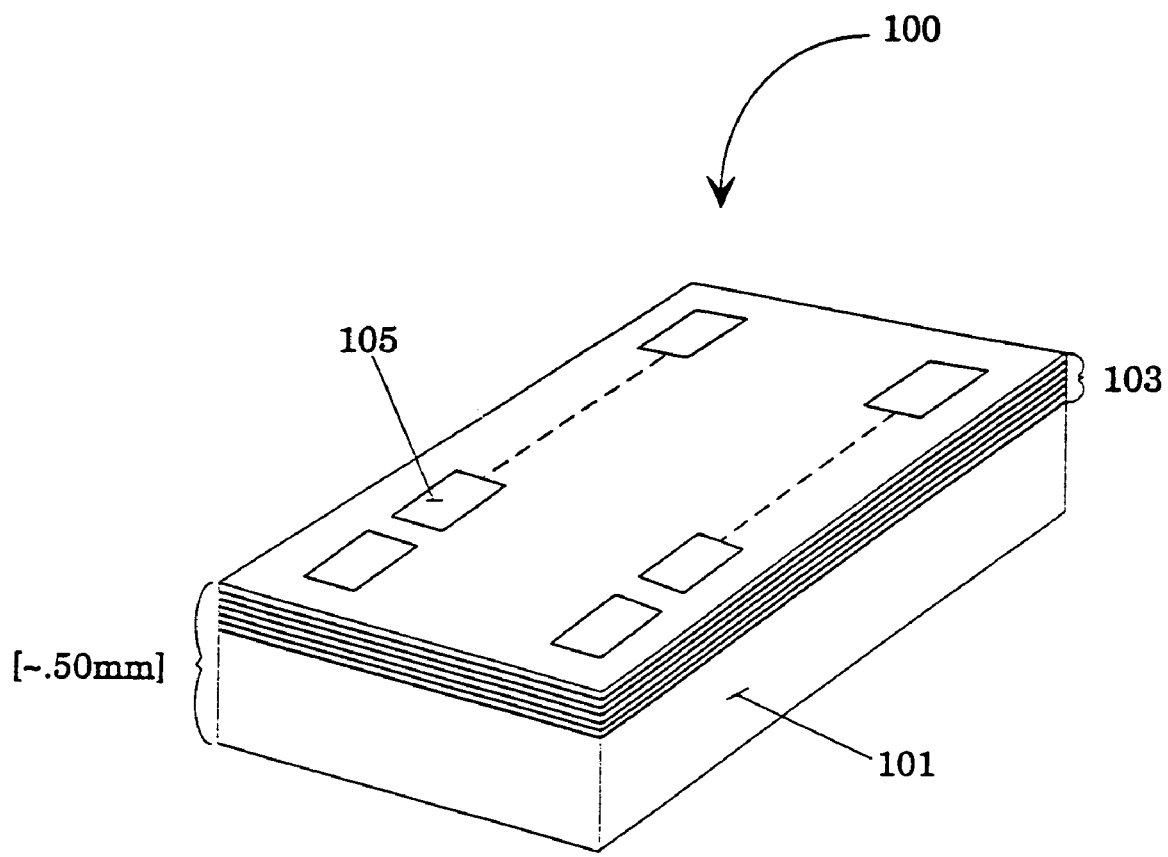
FIG. 1a is a pictorial view of a 3DS DRAM IC manufactured with Method A or Method B and demonstrating the same physical appearance of I/O bond pads as a conventional IC die.
Figure 1B:
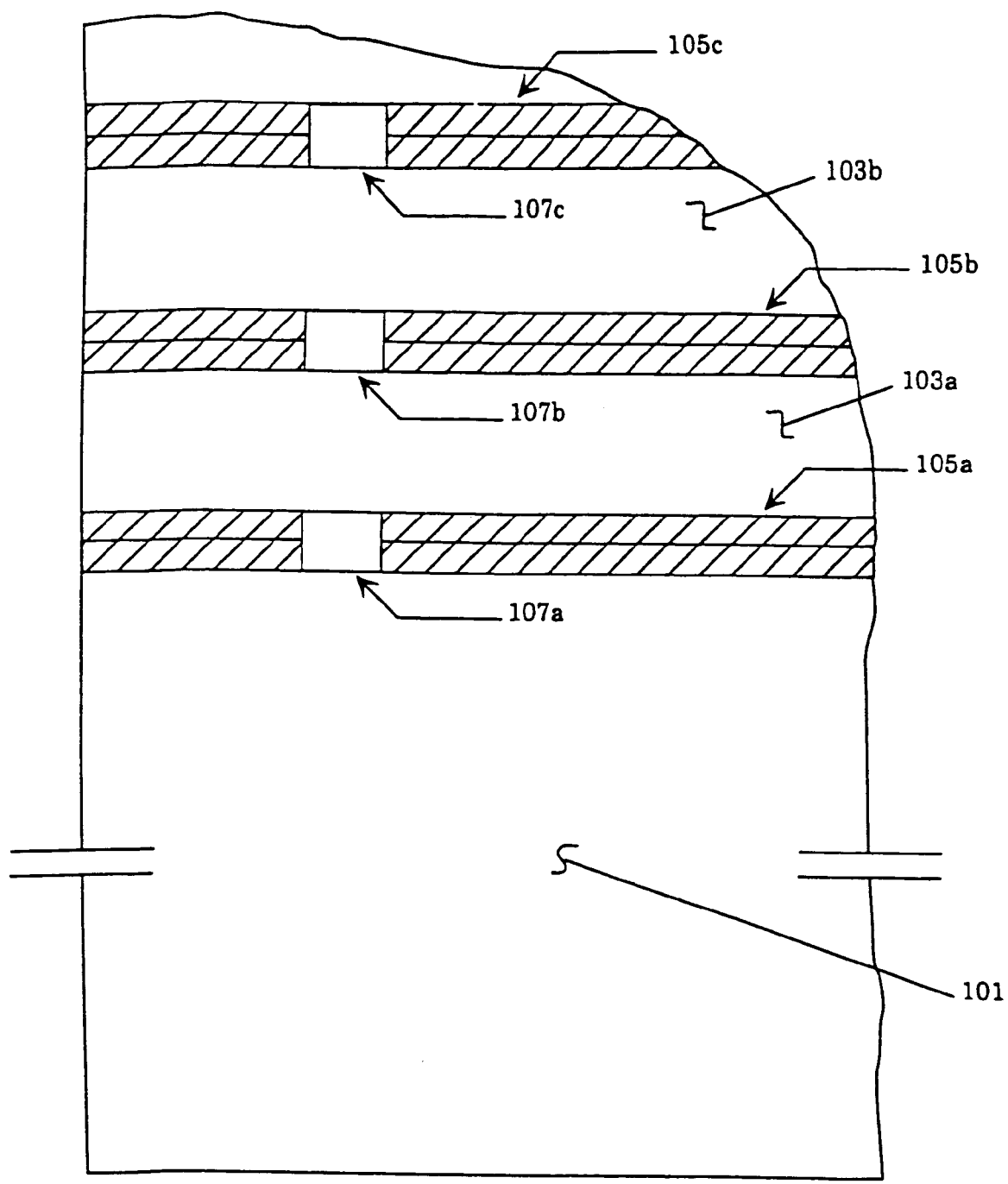
FIG. 1b is a cross-sectional view of a 3DS memory IC showing the metal bonding interconnect between several thinned circuit layers.
Figure 2A:
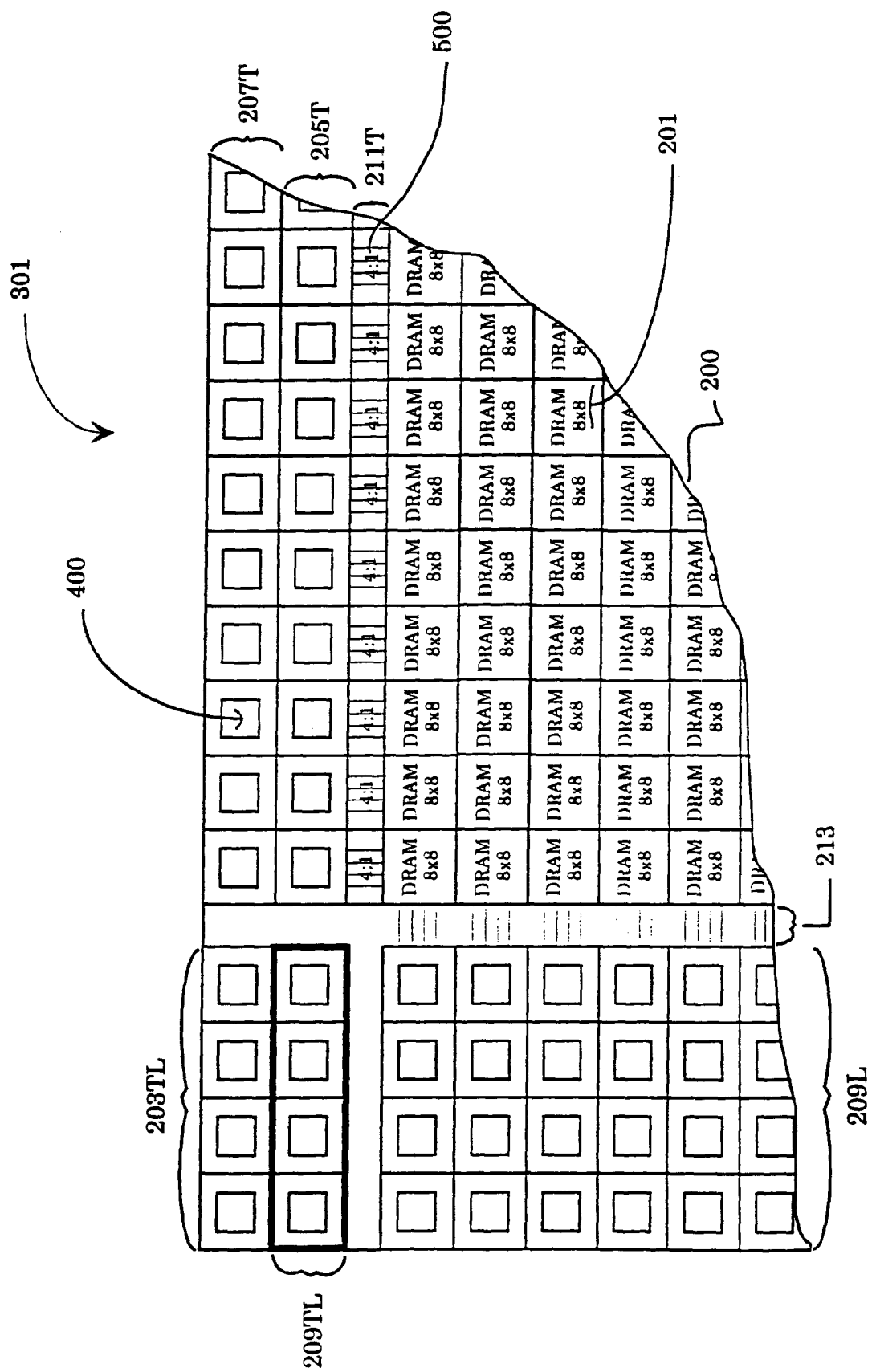
FIG. 2a is a diagram showing the physical layout of a 3DS DRAM array circuit block with one data-line set of bus lines, i.e one port.
Figure 2B:
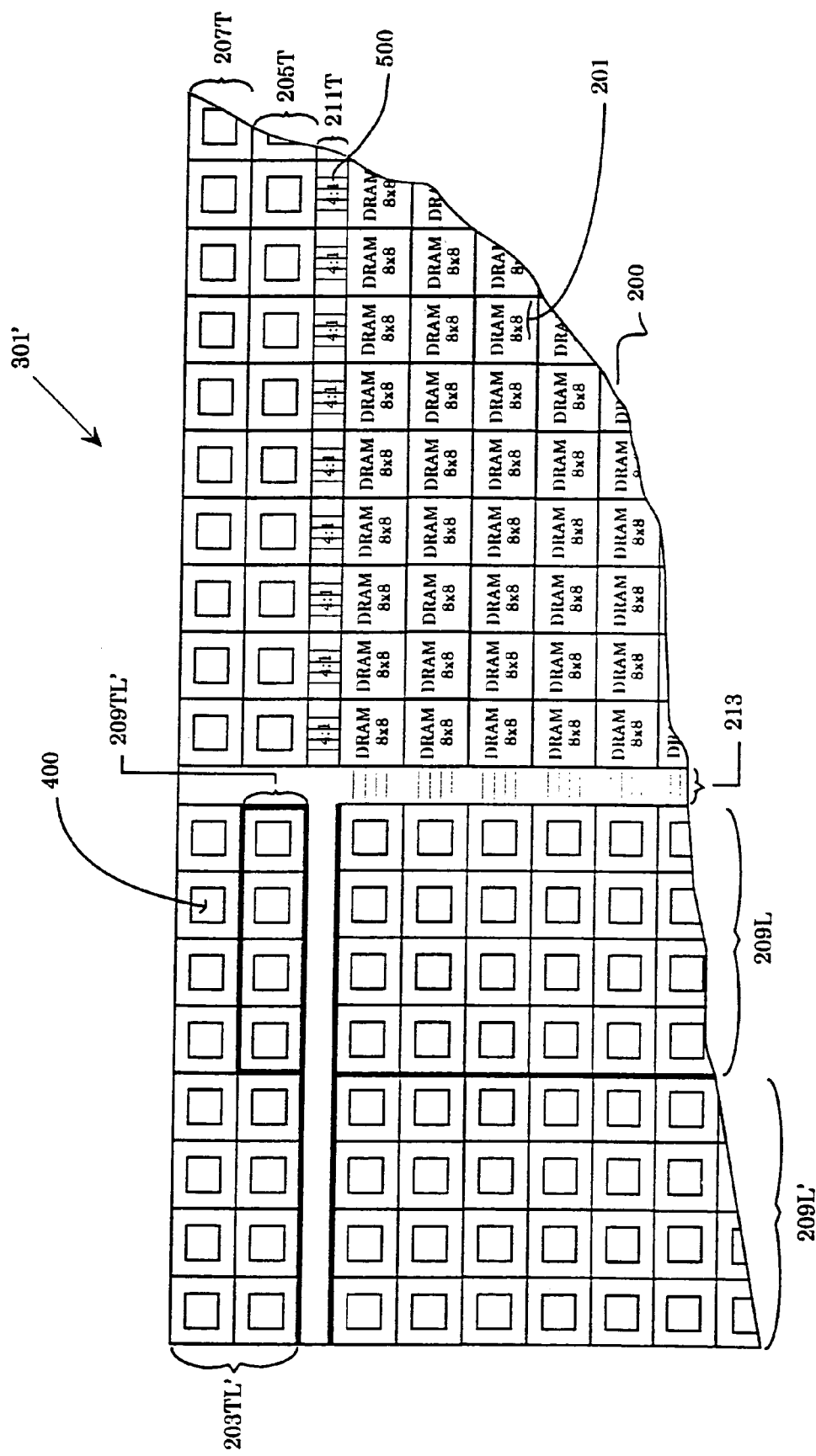
FIG. 2b is a diagram showing the physical layout of a 3DS DRAM array circuit block with two sets of data-line bus lines, i.e. two ports.

Referring to FIG. 1a and FIG. 1b, the 3DS (Three Dimensional Structure) memory device 100 is a stack of integrated circuit layers with fine-grain vertical interconnect between all circuit layers. The term fine-grain inter-layer vertical interconnect is used to mean electrical conductors that pass through a circuit layer with or without an intervening device element and have a pitch of nominally less than 100 µm and more typically less than 10 µm, but not limited to a pitch of less than 2 µm, as best seen in FIG. 2a and FIG. 2b. The fine-grain inter-layer vertical interconnect also functions to bond together the various circuit layers. As shown in FIG. 1b, although the bond and interconnect layers 105a, 105b, etc., are preferably metal, other material may also be used as described more fully hereinafter.

The pattern 107a, 107b, etc. in the bond and interconnect layers 105a, 105b, etc. defines the vertical interconnect contacts between the integrated circuit layers and serves to electrically isolate these contacts from each other and the remaining bond material; this pattern takes the form of either voids or dielectric filled spaces in the bond layers.

The 3DS memory stack is typically organized as a controller circuit 101 and some number of memory array circuit layers 103, typically between nine (9) and thirty-two (32), but there is no particular limit to the number of layers. The controller-circuit is of nominal circuit thickness (typically 0.5 mm or greater), but each memory array circuit layer is a thinned and substantially flexible circuit with net low stress, less than 50 µm and typically less than 10 µm in thickness. Conventional I/O bond pads are formed on a final memory array circuit layer for use with conventional packaging methods. Other metal patterns may be used such as insertion interconnection (disclosed in U.S. Pat. Nos. 5,323,035 and 5,453,404 of the present inventor), DCA (Direct Chip Attach) or FCA (Flip-Chip Attach) methods.

Figure 1C:
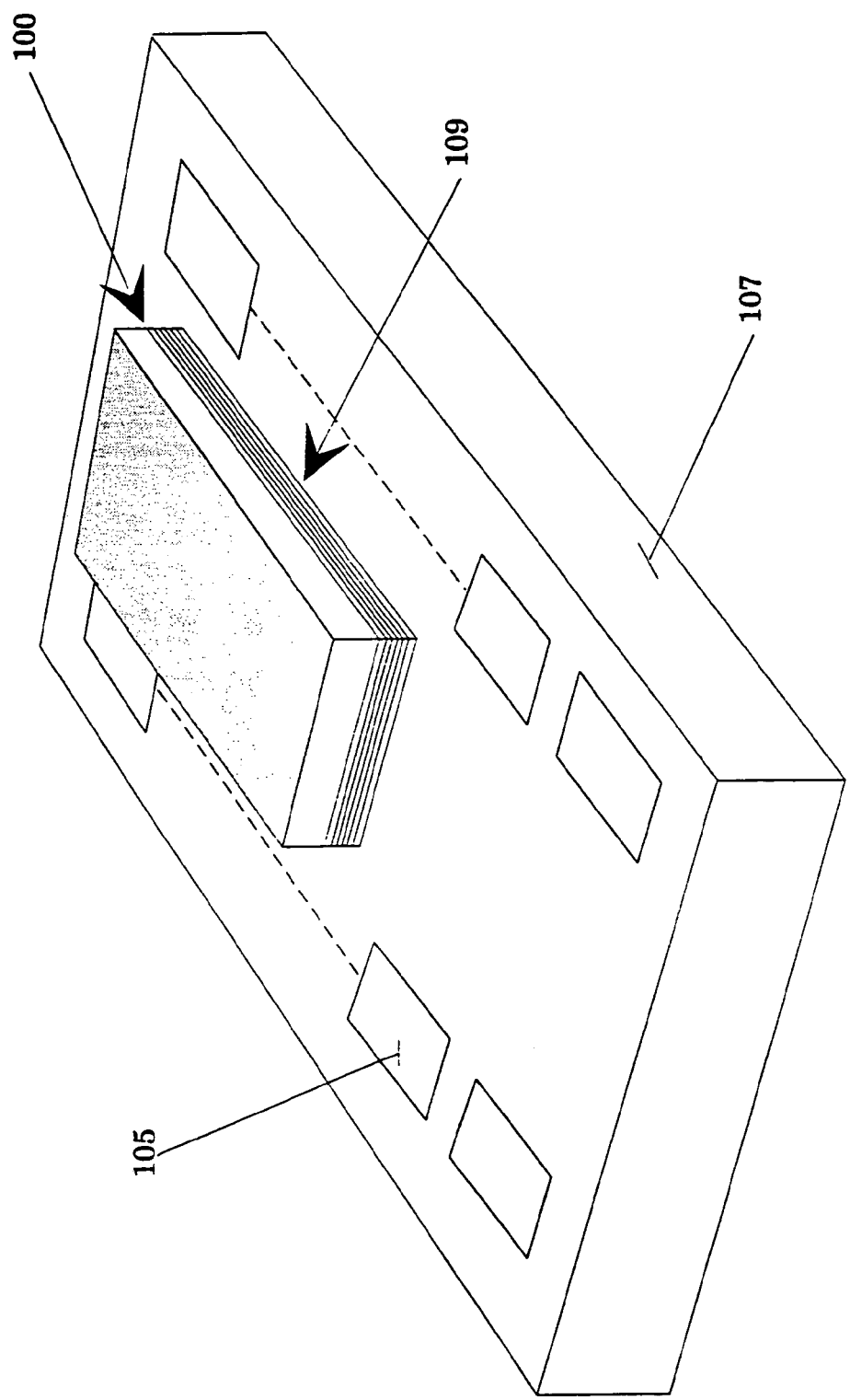
FIG. 1c is a pictorial view of a 3DS DRAM IC stack bonded and interconnected face-down onto a larger conventional IC or another 3DS IC.

Further, the fine grain inter-layer vertical interconnect can be used for direct singulated die bonding between a 3DS memory die and a conventional die (wherein the conventional die could be the controller circuit as shown in FIG. 1c) or a 3DS memory die and another 3DS memory die; it should be assumed that the areas (sizes) of the respective dice to be bonded together can vary and need not be the same. Referring more particularly to FIG. 1c, a 3DS DRAM IC stack 100 is bonded and interconnected face-down onto a larger conventional IC or another 3DS IC 107. Optionally the 3DS stack 100 can be composed of only DRAM array circuits with the DRAM controller circuitry as pan of the larger die. If the DRAM controller circuitry is part of the larger die, then fine-grain vertical bus interconnect would be required (at the face 109 of the 3DS DRAM IC stack 100) to connect the 3DS DRAM array circuit to the DRAM controller, otherwise larger grain conventional interconnection could be incorporated (patterned) into the planarized bond layer.

Figure 3:
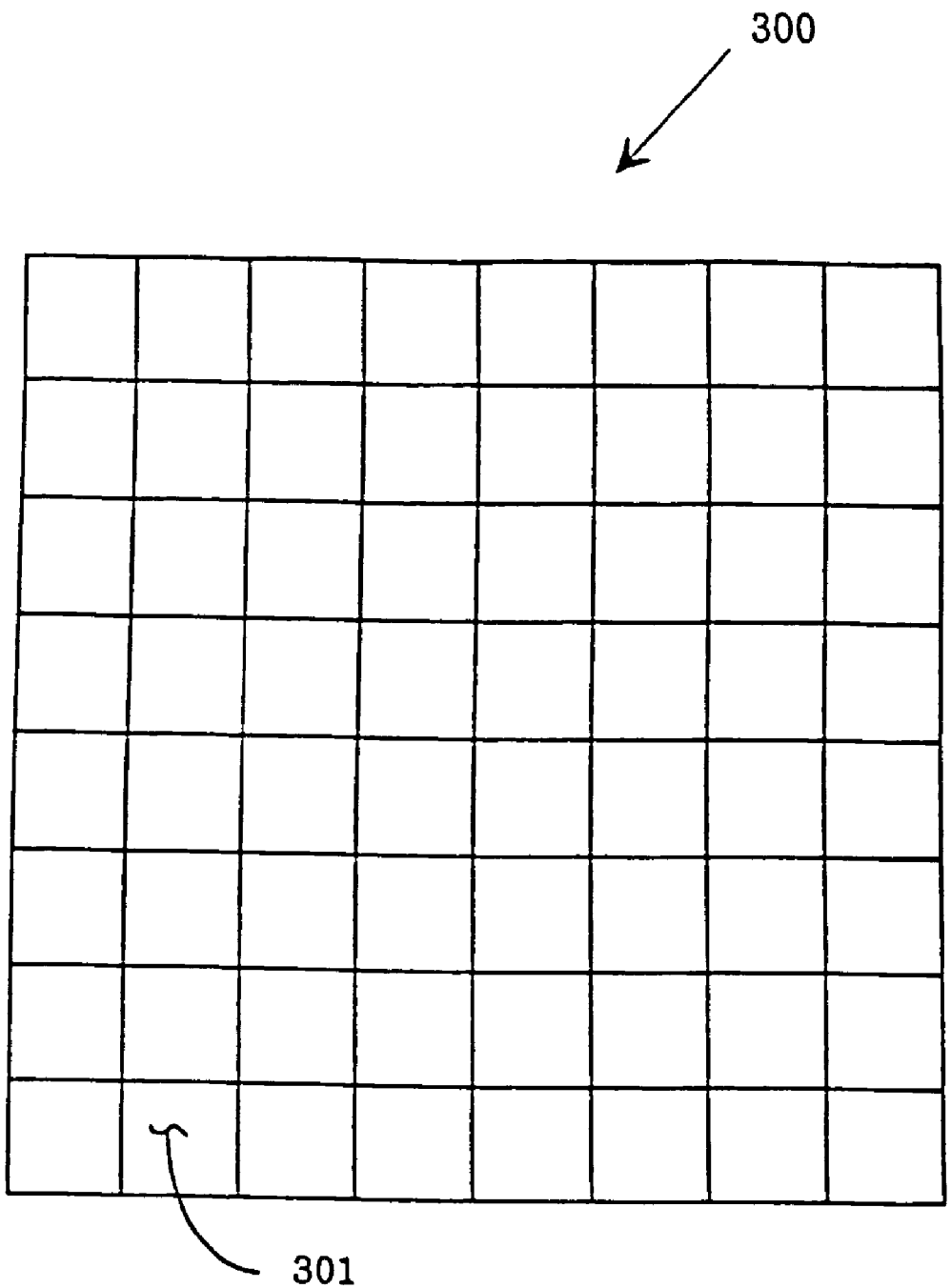
FIG. 3 is a diagram showing the physical layout of a 3DS DRAM array circuit showing partitions for sixty-four (64) 3DS DRAM array blocks.

As shown in FIG. 3, each memory array circuit layer includes a memory array circuit 300 composed of memory array blocks 301 (nominally less than 5 mm² in area) and each block is composed of memory cells (in much the same manner as the cell array of a DRAM or EEPROM circuit), busing electrodes, and—at the option of the designer—enabling gates for selection of specific rows or columns of the memory array. The controller circuit is composed of sense amps, address, control and drive logic that would normally be found at the periphery of a typical memory circuit of monolithic design such as in a conventional DRAM.

Fine-grain busing vertically connects the controller independently to each memory array layer such that the controller can provide drive (power) or enable signals to any one layer without affecting the state of any of the other layers. This allows the controller to test, read or write independently each of the memory circuit layers.

FIG. 2a and FIG. 2b show examples of layouts of possible blocks of a memory array such as the block 301 of FIG. 3. Although only a portion of the block is shown, in the illustrated embodiment, the blocks exhibit bilateral symmetry such that the layout of the complete block may be ascertained from the illustrated portion. Abbreviations "T", "L", and "TL" are used following various reference numerals to indicate "Top", "Left" and Top-Left," respectively, implying corresponding elements not shown in the figure.

Referring to FIG. 2a, a core portion 200 of the block is composed of a "sea" of memory cells. Logically, the aggregation of memory cells may be subdivided into "macrocells" 201 each containing some number of memory cells, e.g. an 8×8 array of 64 memory cells. At the periphery of the core is formed fine-grain vertical interconnect comprising interlayer bond and bus contact metallizations 400, described in greater detail hereinafter with reference to FIG. 4. The fine-grain vertical interconnect includes I/O power and ground bus lines 203TL, memory circuit layer selects 205T, memory macro cell column selects 207T, data lines 209L, and gate-line multiplexer ("mux") selects 209TL. Gate-line multiplexers 211T are, in the illustrated embodiment, 4:1 multiplexers used to select one of four columns within an eight-wide memory macro cell column. Corresponding bottom side 4:1 multiplexers combine with the topside multiplexers 211T to form equivalent 8:1 multiplexers for selecting a single gate-line from an eight-gate-line-wide memory macro cell column.

Figure 5:
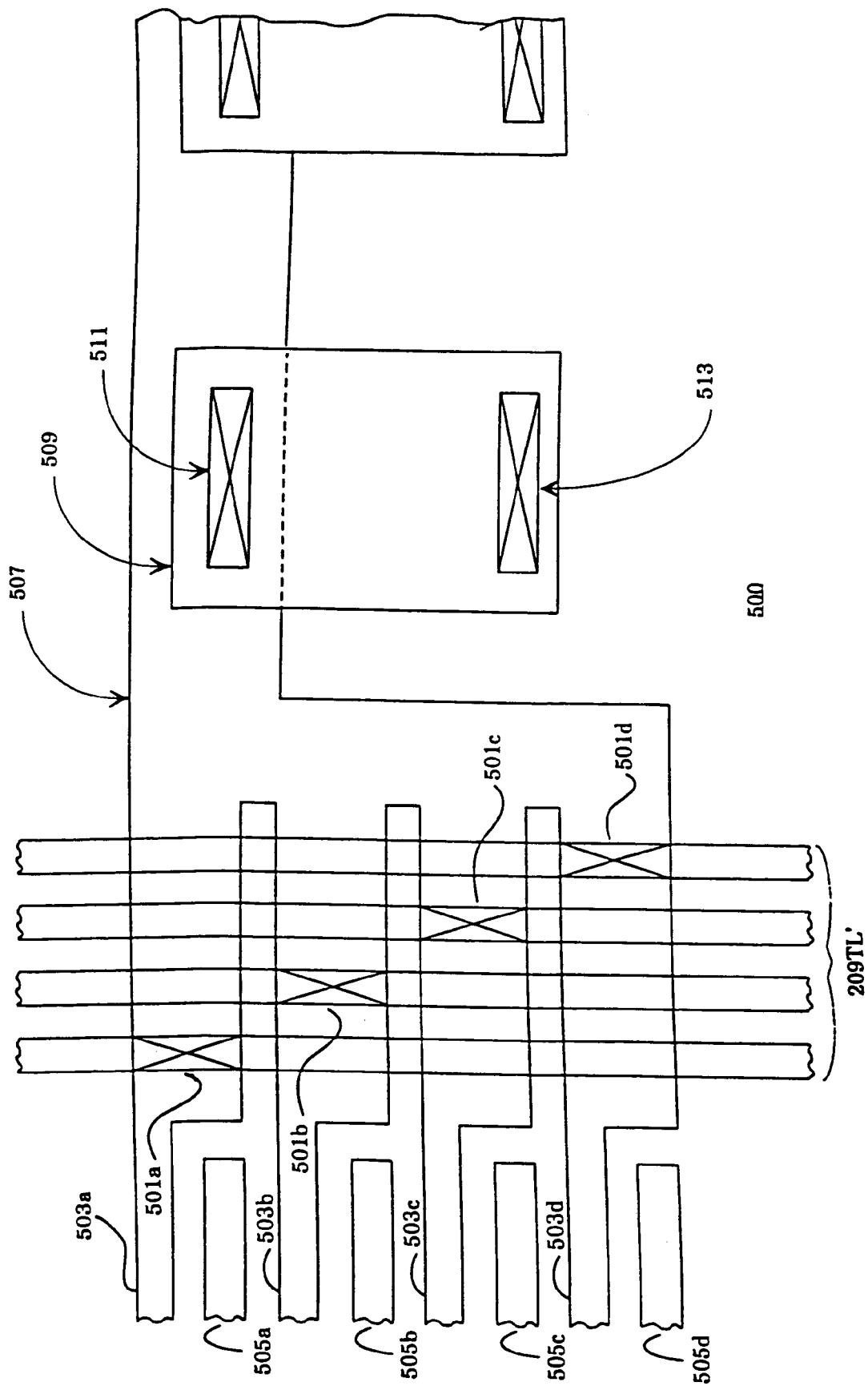
FIG. 5 is a diagram showing the layout of a 3DS memory multiplexer for down-selecting gate-line read or write selection.

One implementation of a 4:1 gate-line bus muliplexer 500 is shown in FIG. 5. Gate-line enables 209TL' (formed in a Metal-1 layer, for example) control transistors 501a through 501d, respectively. Coupled to the transistors are respective gate lines 503a through 503d. Also partly visible are gate-lines 505a through 505d which are coupled to a corresponding 4:1 multiplexer (not shown). When one of the gate-line enables is active, the corresponding gate-line is coupled to an output line 507 of the multiplexer (formed in a Metal-2 layer, for example). The output line is connected to one or more vertical bus connects through a line 509 (formed in a Metal-3 layer and corresponding to metal contact 400 of vertical bus interconnect, for example) and tungsten plugs 511 and 513. The tungsten plug 513 joins the line 509 to a vertical interconnect (not shown).

Referring again to FIG. 2a, in the case of a memory circuit layer, the layer may also include output line enables (gates) from controller layer enable signals 205T, for which I/O enables (gates) 213 may be provided.

Note that at the memory layer level, each memory block 301 is electrically isolated from every other memory block 301. Accordingly, the yield probability for each memory block is independent.

Additional read/write ports can be added as can additional gate-line vertical interconnections; additional vertical interconnection can be used in a redundant manner to improve vertical interconnect yield. The 3DS memory circuit can be designed to have one or more data read and write bus port interconnections. Referring to FIG. 2b, a memory block 301' is shown as having a port $P_0$, (209L) and a further port $P_1$ (209L'). The only limitation on the number of vertical interconnections is the overhead such vertical interconnections impose on the cost of the circuit The fine-grain vertical interconnect method allows thousands of interconnects per block at an increase in die area of only a few percent.

As an example, the overhead of the vertical interconnect shown in FIG. 2b for a DRAM memory block of 4 Mbits with two read/write ports and implemented in 0.35 µm or 0.15 µm design rules consists of approximately 5,000 connections and is less than 6% of the total area of the memory array block. Therefore, the vertical interconnect overhead for each memory array circuit layer in the 3DS DRAM circuit is less than 6%. This is significantly less than that presently experienced in monolithic DRAM circuit desions where the percentage of non-memory cell area can exceed 40%. In a completed 3DS DRAM circuit the percentage of non-memory cell area is typically less than 10% of the total area of au circuits in the stacked structure.

The 3DS memory device decouples control functions that normally would be found adjacent the memory cells of monolithic memory circuits and segregates them to the controller circuit. The control functions, rather than occurring on each memory array layer as in conventional memory ICs, occur only once in the controller circuit. This creates an economy by which several memory array layers share the same controller logic, and therefore, lowers the net cost per memory cell by as much as a factor of two versus conventional memory design.

The segregation of the control functions to a separate controller circuit allows more area for such functions (i.e., an area equal to the area one or several of the memory array blocks). This physical segregation by function also allows fabrication process segregation of the two very different fabrication technologies used for the control logic and the memory array, again realizing additional fabrication cost savings versus the more complicated combined logic/memory fabrication process used for conventional memory. The memory array can also be fabricated in a process technology without consideration of the process requirements of control logic functions. This results in the ability to design higher performance controller functions at lower cost than is the case with present memory circuits. Furthermore, the memory array circuit can also be fabricated with fewer process steps and nominally reduce memory circuit fabrication costs by 30% to 40% (e.g., in the case of a DRAM array, the process technology can be limited to NMOS or PMOS transistors versus CMOS).

Hence, although bonding of sufficiently planar surfaces of a memory controller substrate and a memory array substrate using thermal diffusion metal bonding is preferred, in the broader aspects of the present invention, the invention contemplates bonding of separate memory controller and memory array substrates by any of various conventional surface bonding methods, such as anisotropically conductive epoxy adhesive, to form interconnects between the two to provide random access data storage.

Figure 2C:
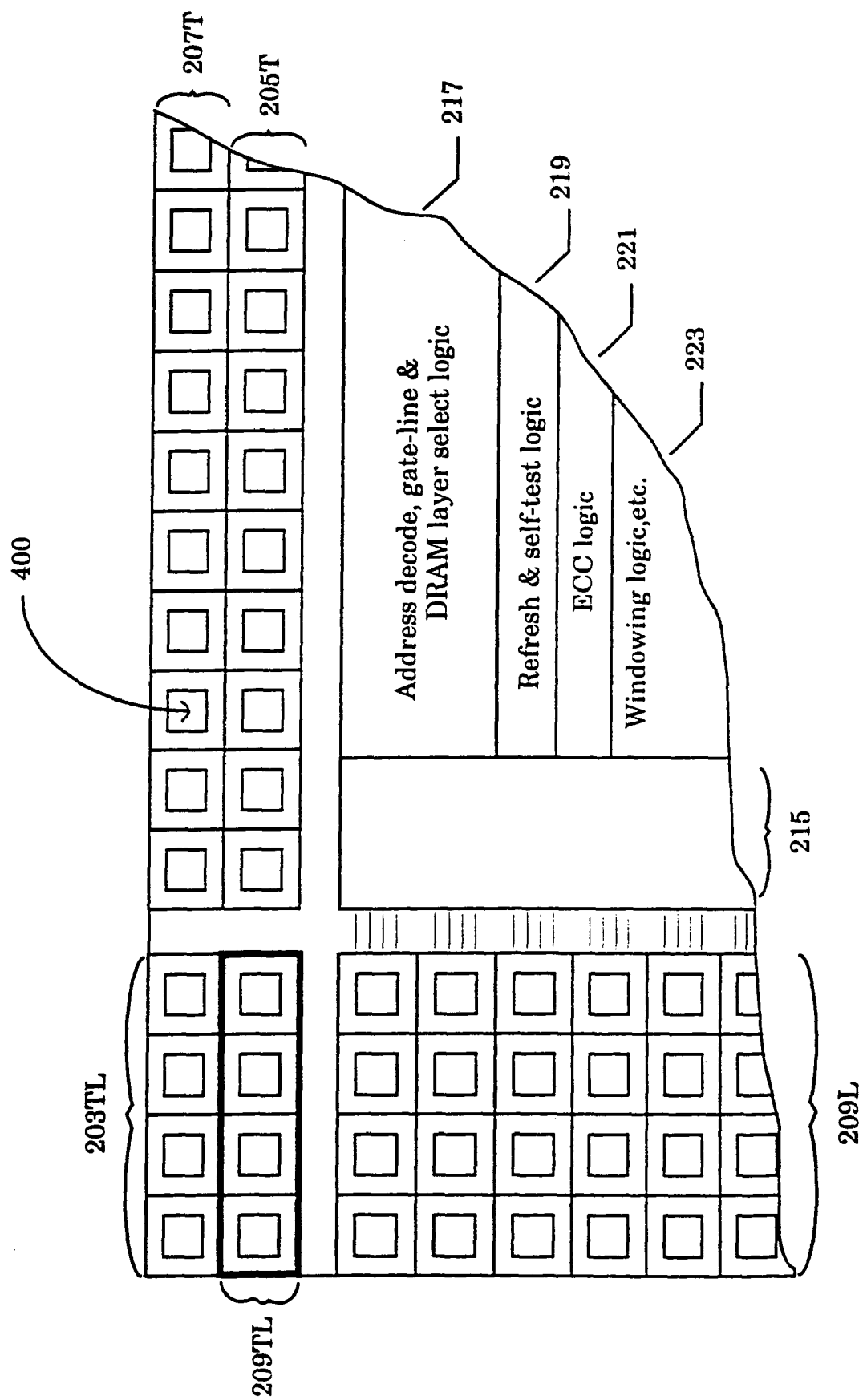
FIG. 2c is a diagram showing the physical layout of a portion of an exemplary memory controller circuit.

Referring to FIG. 2c, the layout of a portion of an exemplary memory controller circuit is shown. The inter-layer bond and bus contact metallization has the same pattern as previously described in relation to FIG. 2a. Instead of a sea of memory cells, however, there is provided memory controller circuitry including, for example, sense amps and data line buffers 215. Because of the increased availability of die area, multi-level logic may be provided in conjunction with the sense amps and data line buffers 215. Also shown are address decode, gate-line and DRAM layer select logic 217, refresh and self-test logic 219, ECC logic 221, windowing logic 223, etc. Note that self-test logic, ECC logic, and windowing logic are provided in addition to functions normally found within a DRAM memory controller circuit. Depending on die size or the number of controller circuit layers used, any of numerous other functions may also be provided including, for example, virtual memory management, address functions such as indirect addressing or content addressing, data compression, data decompression, audio encoding, audio decoding, video encoding, video decoding, voice recognition, handwriting recognition, power management, database processing, graphics acceleration functions, microprocessor functions (including adding a microprocessor substrate), etc.

The size of the 3DS memory circuit die is not dependent on the present constraint of containing the necessary number of memory cells and control function logic on one monolithic layer. This allows the circuit designer to reduce the 3DS circuit die size or choose a die size that is more optimal for the yield of the circuit. 3DS memory circuit die size is primarily a function of the size and number of memory array blocks and the number of memory array layers used to fabricate the final 3DS memory circuit. (The yield of a nineteen (19) layer, 0.25 µm process 3DS DRAM memory circuit may be shown to be greater than 90% as described below.) This advantage of selecting the 3DS circuit die size enables an earlier first production use of a more advanced process technology than would normally be possible for conventional monolithic circuit designs. This, of course, implies additional cost reductions and greater performance over the conventional memory circuits.

3DS Memory Device Fabrication Methods

There are two principal fabrication methods for 3DS memory circuits. The two 3DS memory fabrication methods, however, have a common objective which is the thermal diffusion metal bonding (also referred to as thermal compression bonding) of a number of circuit substrates onto a rigid supporting or common substrate which itself may optionally also be a circuit component layer.

The supporting or common substrate can be a standard semiconductor wafer, a quartz wafer or a substrate of any material composition that is compatible with the processing steps of the 3DS circuit, the operation of the circuit and the processing equipment used. The size and shape of the supporting substrate is a choice that best optimizes available manufacturing equipment and methods. Circuit substrates are bonded to the supporting substrate and then thinned through various methods. Circuit substrates may be formed on standard single crystal semiconductor substrates or as polysilicon circuits formed on an appropriate substrate such as silicon or quartz.

Polysilicon transistor circuits have the important cost saving option of incorporating a parting layer (film) that allows the substrate upon which the polysilicon circuits are formed to be released and reused. Polysilicon transistor or TFTs (Thin Film Transistor) devices are widely used, and need not be made solely from silicon.

The various circuit layers of the 3DS memory circuit are bonded together by use of thermal diffusion of two metal surfaces, typically aluminum. The surface of the circuits to be bonded are smooth and sufficiently planar as is the case with the surface of an unprocessed semiconductor wafer or a processed semiconductor wafer that has been planarized with the CMP (Chemical Mechanical Processing) method with a surface planarity of less than 1 µm and preferably less than 1,000 Å over at least the area of the surface of the circuit (formed on the substrate) to be bonded. The metal bonding material on the surfaces of the circuits to be bonded are patterned to be mirror images of each other and to define the various vertical interconnect contacts as indicated in FIG. 2a, FIG. 2b, FIG. 2c and FIG. 5. The step of bonding two circuit substrates results in simultaneously forming the vertical interconnection between the two respective circuit layers or substrates.

The thermal diffusion bonding of the circuit layers takes place preferably in an equipment chamber with controlled pressure and atmospheric components such as $N_2$ with little $H_2O$ and $O_2$ content. The bonding equipment aligns the patterns of the substrates to be bonded, presses them together with a set of programmed pressures and at one or more temperatures for a period of time as required by the type of metal used as the bonding material. The thickness of the bonding material is nominally in a range of 500 Å to 15,000 Å or greater with a preferred thickness of 1,500 Å. The initial bonding of the substrates is preferably done at lower than standard pressure such as a negative pressure between 1 torr and 740 torr depending on the design of the bond pattern. This can leave an interior negative pressure between the bonding surfaces once external atmospheric pressure is returned which further assists in the formation of the bond and enhances the reliability of the bond.

The preferred bonding material is pure aluminum or an alloy of aluminum, but it is not limited to aluminum and may include, for example, such metals as Sn, Ti, In, Pb, Zn, Ni, Cu, Pt, Au or alloys of such metals that provide acceptable surface bond diffusion capabilities at acceptable temperatures and forming periods. The bonding material is not limited to metal, and could be a combination of bonding materials, such as highly conductive polysilicon, some of which are non-conducting such as silicon dioxide, and the foregoing exemplary types of bond material choices should not be considered to be limitations on how the circuit layers can be bonded.

In the case where metal bond materials form a native surface oxide that either inhibits the forming of a satisfactory bond or may increase the resistance in the vertical interconnections formed by the bond, the oxide should be removed. The bonding equipment provides an oxide reduction capability such that bonding surfaces of the bond material are rendered without native surface oxide. The methods of forming gas atmospheres for the reduction of surface oxides are well known, and there are other methods for removing the native oxide such as sputter etching, plasma etching or ion mill etching. In the case w here aluminum is used as the bonding material, it is preferred that the thin native aluminum oxide film of approximately 40 Å on the bonding surfaces be removed prior to bonding.

The thinned (substantially flexible) substrate circuit layers of the 3DS memory circuit are typically memory array circuits, however, the thinned substrate circuit layers are not limited to memory circuits. Other circuit layer types can be controller circuits, non-volatile memory such as EEPROM, additional logic circuitry including microprocessor logic and application specific logic functions such as those that support graphic or database processing, etc. The selection of such circuit layer types follows from the functional requirements of the design of the circuit and is not limited by the 3DS memory fabrication process.

The thinned (substantially flexible) substrate circuit layers are preferably made with dielectrics in low stress (less than $5 \times 10^8$ dynes/cm$^2$) such as low stress silicon dioxide and silicon nitride dielectrics as opposed to the more commonly used higher stress dielectrics of silicon oxide and silicon nitride used in conventional memory circuit fabrication. Such low stress dielectrics are discussed at length in U.S. Pat. No. 5,354,695 of the present inventor, incorporated herein by reference. The use of dielectrics with conventional stress levels could be used in the assembly of a 3DS DRAM circuit, however, if more than a few layers comprise the stacked assembly, each layer in the assembly will have to be stress balanced so that the net stress of the deposited films of a layer is less than $5 \times 10^8$ dynes/cm². The use of intrinsically low stress deposited films is the preferred method of fabrication versus the use of the method where the stress of individually deposited films are not equal but are deposited to create a net balanced lower stress.

Method A, 3DS Memory Device Fabrication Sequence

This fabrication sequence assumes that several circuit layers will be bonded to a common or support substrate and subsequently thinned in place. An example of a resulting 3DS memory circuit is shown in FIG. 1a.

1. Align and bond to the common substrate the topside of a second circuit substrate.

2A. Grind the backside or exposed surface of the second circuit substrate to a thickness of less than 50 µm and then polish or smooth the surface. The thinned substrate is now a substantially flexible substrate.

Optionally an etch stop may be incorporated in the second substrate from less than a micron to several microns below the semiconductor surface prior to device fabrication. This etch stop can be an epitaxially formed film such as GeB (described in U.S. Pat. Nos. 5,354,695 and 5,323,035 of the present inventor, incorporated herein by reference) or a low density implanted layer of $O_2$ or $N_2$ to form a buried oxide or nitride barrier etch stop layer just below the device layer on the topside of the second substrate. After a preliminary grinding of a significant portion of the backside of the substrate, the remaining portion of the backside of the second substrate is then selectively etched in a chemical bath which stops on the surface of the eptiaxial or implanted layer. Subsequent polishing and RIE steps as necessary can then be used to complete the thinning of the second substrate.

Alternately, a parting layer such as $H_2$ implanted into the topside surface of the second substrate prior to device fabrication can be used with a thermal step to crack off the majority of the backside of the second substrate, allowing its reuse.

2B. The second substrate may alternatively be a circuit formed of polysilicon transistors or TFTs over a parting layer such as aluminum, titanium, AlAs, KBr, etc. which can be activated by a specific chemical release agent The backside of the second substrate is then removed upon activating (dissolving) the release layer and followed as needed by interconnect semiconductor processing steps.

3. Process the thinned backside of the second substrate to form vertical interconnections such as that shown in FIG. 4 with the bonded surface side of the second substrate. The backside processing typically comprises conventional semiconductor processing steps of dielectric and metal deposition, lithography and RIE, the order of which can vary to a great degree. The completion of the backside processing will also result in a patterned metal layer that is similar to the topside bond material pattern to facilitate the subsequent bonding of an additional circuit substrate, a terminal pattern such as a conventional I/O IC bond pad (wire bonding) pattern, a pattern for thermal diffusion bonding of the 3DS memory circuit to another die (either another 3DS circuit or a conventional die), or a pattern for insertion interconnection, conventional DCA (Direct Chip Attach) or FCA (Flip-Chip Attach).

Figure 4:
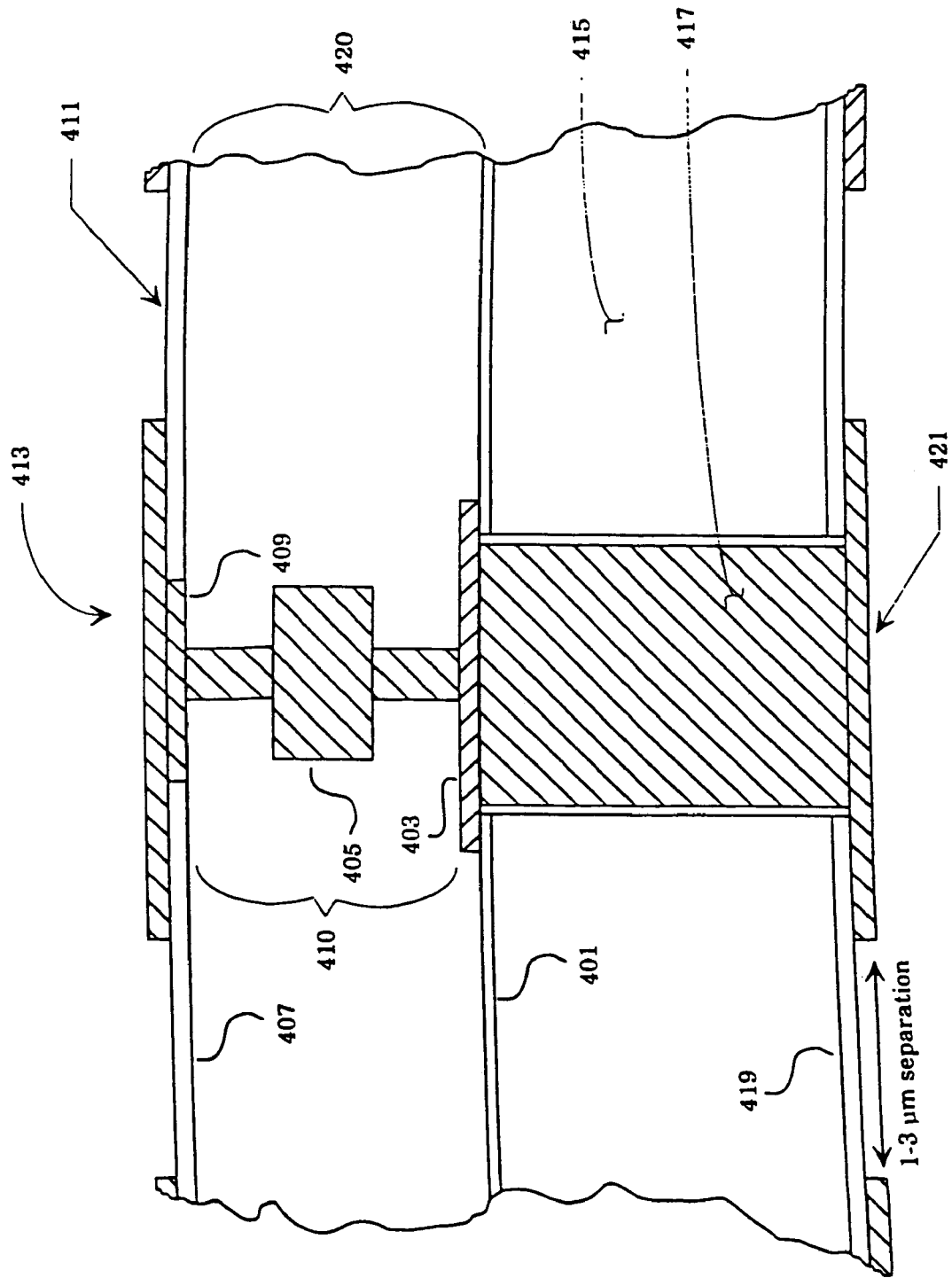
FIG. 4 is a cross-sectional view of a generic 3DS vertical interconnection or feed-through in a thinned substrate.

Referring more particularly to FIG. 4, during the fabrication of active circuit devices, an oxide mask 401 is thermally grown or deposited. Vertical bus contacts 403 are then formed, for example from highly-doped polysilicon coincident with a polysilicon gate forming step. Alternatively, contact 403 may be formed of metal. Conventional DRAM interconnect structures 410 are then formed using conventional processing. The DRAM interconnect may include an internal pad 405. The "DRAM processed" portion 420 of the wafer includes various dielectric and metal layers. A final passivation layer 407 is deposited, after which vias 409 are formed. Conventional CMP processing is then used to obtain a planar surface 411. Contacts 413 and bond surfaces not shown are then patterned in a top-most metal layer (e.g, Metal-3).

After bonding and thinning of the backside of the second substrate to about 1-8 µm of silicon (or other semiconductor) substrate 415, feed-throughs 417 are then formed in registration with the contacts 403. A passivation layer 419 and contacts 421 are then formed. The contacts 421 may be formed so as to form a mirror image of the contacts 413, allowing for the bonding of further wafers.

4. If another circuit layer is to be bonded to the 3DS circuit stack, steps 1-3 are repeated.

5A. The circuits of the finished 3DS memory substrate are then conventionally sawed into die (singulated), resulting in a circuit of the type shown in FIG. 1a, and packaged as would be the case with conventional integrated circuits.

5B. The circuits of the finished 3DS memory substrate are then conventionally sawed and then individually aligned and thermal diffusion bonded (metal pattern down) to the surface of a second (conventional IC) die or MCM substrate in a manner similar to that used in the bonding of the circuit substrates of step 1 above. (The conventional die or MCM substrate may have a larger area than the 3DS memory substrate and may include a graphics controller, video controller or microprocessor, such that the 3DS becomes embedded as part of another circuit.) This final bonding step typically incorporates a fine-grain interconnect between the 3DS memory circuit and the die or MCM substrate, but could also use a conventional interconnect pattern. Further, a 3DS memory circuit can be bonded face up to a conventional IC in die form or MCM substrate and wire bonding used to form conventional I/O interconnections.

Method B, 3DS Memory Device Fabrication Sequence

This fabrication sequence assumes that a circuit substrate will first be bonded to a transfer substrate, thinned and then bonded to a common substrate as a layer of the circuit stack. The transfer substrate is then released. This method has the advantage over Method A of allowing substrates to be thinned prior to being bonded to the final circuit stack and allows for simultaneous thinning and vertical interconnect processing of substrate circuit layers.

1. Bond to a transfer substrate a second circuit substrate using a release or parting layer. A transfer substrate may have high tolerance parallel surfaces (TTV or Total Thickness Variance of less than 1 µm) and may be perforated with an array of small holes to assist the parting process. The parting layer can be a blanket deposition of a bonding metal. Precise alignment of the surfaces is not required.

2. Perform step 2A or 2B of Method A.

3. Process the backside of the second substrate to form interconnections with the bonded topside surface of the second substrate as shown in FIG. 4. The backside processing typically comprises conventional semiconductor processing steps of dielectric and metal deposition, lithography and RIE, the order of which can vary to great degree. The completion of the backside processing will also result in a patterned metal layer that is similar to the bond material pattern of the common substrate to facilitate the subsequent bonding of an additional circuit layer.

4. Bond the second circuit to a common or support substrate (3DS stack) and release the transfer substrate by activating the parting layer between it and the second circuit.

5. Process the now exposed topside of the second substrate to form interconnections for subsequent substrate bonding or a terminal pattern for conventional I/O bonding (wire bonding) pad pattern, a pattern for thermal diffusion bonding of the 3DS memory circuit to another die (either another 3DS circuit or a conventional die), or a pattern for conventional insertion interconnect, DCA (Direct Chip Attach) or FCA (Flip-Chip Attach). If another circuit layer is to be bonded to the 3DS circuit stack, steps 1 through 4 are repeated.

6. Perform step 5A or 5B of Method A.

3DS Memory Device Yield Enhancement Methods

The 3DS circuit may be considered a vertically assembled MCM (Multi-Chip Module) and as with an MCM the final yield is the product of the yield probabilities of each component circuit (layer) in the completed 3DS circuit. The 3DS circuit uses several yield enhancement methods that are synergistic in their combined usage within a single memory IC. The yield enhancement methods used in the 3DS memory circuit include small memory array block size, memory array block electrical isolation through physically unique or separate vertical bus interconnections, intra memory array block gate-line sparing, memory array layer sparing (inter-block gate-line sparing), controller sparing and ECC (Error Correcting Codes). The term sparing is used to mean substitution by a redundant element The selected size of the memory array block is the first component in the yield equation for the 3DS memory circuit. Each memory array block is individually (uniquely) accessed and powered by the controller circuit and is physically independent of each and every other memory array block including those on the same memory array layer in addition to those on a different memory array layer. The size of the memory array block is typically less than 5 mm$^2$ and preferably less than 3 mm$^2$, but is not limited to a specific size. The size of memory array block, the simplicity of its NMOS or PMOS fabrication process and its physical independence from each of the other memory array blocks, for nearly all production IC processes, provides a conservatively stated nominal yield of greater than 99.5%. This yield assumes that most point defects in the memory array block such as open or shorted interconnect lines or failed memory cells can be spared (replaced) from the intra-block or inter-block set of redundant gate-lines. Major defects in a memory array block which render the complete memory array block unusable result in the complete sparing of the block from a redundant memory array layer or the rejection of the 3DS circuit.

In the example of a 3DS DRAM circuit the yield of a stack of memory array blocks is calculated from the yield equation $Ys=((1-(1-P_y)^2)^n)^b$, where n is the number DRAM array layers, b is the number of blocks per DRAM array and $P_y$ is the effective yield (probability) of a DRAM array block less than 3 mm$^2$ in area. Assuming a DRAM array block redundancy of 4% for gate-lines in the DRAM array block lines and one redundant DRAM array layer, and assuming further that the number of blocks per layer is 64, the number of memory array layers in the stack is 17 and the effective value for Py is 0.995, then the stack yield Ys for the complete memory array (including all memory array block stacks) is 97.47%.

The Ys memory array stack yield is then multiplied by the yield of the controller Yc. Assuming a die size of less than 50 mm$^2$, a reasonable Yc for a controller fabricated from a 0.5 µm BiCMOS or mixed signal process would be between 65% and 85%, giving a net 3DS memory circuit yield of between 63.4% and 82.8%. If a redundant controller circuit layer is added to the 3DS memory stack, the yield probabilities would be between 85.7% and 95.2%.

The effective yield of a memory array block can be further increased by the optional use of ECC logic. ECC logic corrects data bit errors for some group size of data bits. The syndrome bits necessary for the operation of ECC logic would be stored on redundant gate-lines of any of the memory array layers in a vertically associated block stack. Further, if necessary, in order to accommodate the storage of ECC syndrome bits, additional memory array layers could be added to the circuit.

Advantageous 3DS Memory Device Controller Capabilities

As compared to a conventional memory circuit, the 3DS memory controller circuit can have various advantageous capabilities due the additional area available for controller circuitry and the availability of various mixed signal process fabrication technologies. Some of these capabilities are self-test of memory cells with dynamic gate-line address assignment, virtual address translation, programmable address windowing or mapping, ECC, data compression and multi-level storage.

Dynamic gate-line address assignment is the use of programmable gates to enable the layer and gate-line for a read/write operation. This allows the physical order of memory storage to be separate or different from the logical order of stored memory.

The testing of each generation of memory devices has resulted in significantly increased test costs. The 3DS memory controller reduces the cost of testing by incorporating sufficient control logic to perform an internal test (self-test) of the various memory array blocks. Circuit testing in the conventional ATE manner is required only for verification of controller circuit functions. The scope of the internal test is further extended to the programmable (dynamic) assignment of unique addresses corresponding to the various gate-lines of each memory array block on each layer. Self-test capability of the 3DS controller circuit can be used anytime during the life of the 3DS memory circuit as a diagnostic tool and as a means to increase circuit reliability by reconfiguring (sparing) the addresses of gate-lines that fail after the 3DS memory circuit is in use in a product ECC is a circuit capability that if included in the controller circuit, can be enabled or disabled by a programming signal or made a dedicated function.

Data compression logic will allow the total amount of data that can be stored in the 3DS memory array to be increased. There are various generally known data compression methods available for this purpose.

Larger sense amps allow greater dynamic performance and enable higher speed read operations from the memory cells. Larger sense amps are expected to provide the capability to store more than one bit (multi-level storage) of information in each memory cell; this capability has already been demonstrated in non-volatile memory circuits such as flash EPROM. Multi-level storage has also been proposed for use in the 4 Gbit DRAM generation circuits.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. An integrated circuit structure comprising:
a first substrate comprising a first surface having interconnect contacts; and
a second substrate having a thickness of about 50 microns or less and comprising a first surface and a second surface at least one of which has interconnect contacts, wherein the second surface is opposite the first surface and wherein the second surface of the second substrate is polished; and
conductive paths between the interconnect contacts of the first surface of the first substrate and said one of the first surface of the second substrate and the second surface of the second substrate;
wherein the first surface of the first substrate and one of the first surface of the second substrate and the second surface of the second substrate are bonded in a stacked relationship, the first substrate overlapping at least a majority of the second substrate.

2. The integrated circuit structure of claim 1, wherein the second substrate is one of a thin monocrystalline semiconductor substrate and a thin polycrystalline semiconductor substrate.

3. The integrated circuit structure of claim 1, wherein circuitry is formed on the second substrate, said circuitry comprising one of active circuitry and passive circuitry.

4. The integrated circuit structure of claim 1, wherein circuitry is formed on the second substrate comprising both active circuitry and passive circuitry.

5. The integrated circuit structure of claim 1, wherein the first substrate is a substrate having circuitry formed thereon.

6. The integrated circuit structure of claim 5, wherein the circuitry of the first substrate comprises one of active circuitry and passive circuitry.

7. The integrated circuit structure of claim 5, wherein the circuitry of the first substrate comprises both active circuitry and passive circuitry.

8. The integrated circuit structure of claim 1, further comprising:
at least one additional thin substrate having circuitry formed thereon;
a first of said at least one additional thin substrate being bonded to the second substrate and any additional thin substrates being bonded to a directly adjacent additional thin substrate; and
conductive paths formed between said first of said at least one additional thin substrate and at least one of said first and second substrates and also between each additional thin substrate and at least one of said substrates of the integrated circuit structure.

9. The integrated circuit structure of claim 8, wherein at least two of the first, the second and the at least one additional thin substrates are formed using different respective process technologies, wherein the different respective process technologies are selected from the group consisting of a DRAM process technology, a SRAM process technology, a FLASH process technology, an EPROM process technology, an EEPROM process technology, a Ferroelectric process technology and a Giant Magneto Resistance process technology.

10. The integrated circuit structure of claim 8, wherein at least one of the first, the second and the at least one additional thin substrates comprises a microprocessor.

11. The integrated circuit structure of claim 8, wherein:
at least one substrate of the first, the second and the at least one additional thin substrates has memory circuitry formed thereon; and
at least one substrate of the first, the second and the at least one additional thin substrates has logic circuitry formed thereon that performs tests on the at least one substrate that has memory circuitry formed thereon.

12. The integrated circuit structure of claim 8, wherein at least one substrate of the first, the second and the at least one additional thin substrates has memory circuitry formed thereon, the memory circuitry having a plurality of memory locations, wherein at least one memory location of the plurality of memory locations is used for sparing and wherein data from the at least one memory location on the at least one substrate having memory circuitry formed thereon is used instead of data from a defective memory location on the at least one substrate that has memory circuitry formed thereon.

13. The integrated circuit structure of claim 8, wherein:
at least one substrate of the first, the second and the at least one additional thin substrates has memory circuitry formed thereon; and
at least one substrate of the first, the second and the at least one additional thin substrates has logic circuitry formed thereon that performs programmable gate line address assignment with respect to the at least one substrate having memory circuitry formed thereon.

14. The integrated circuit structure of claim 8, further comprising a plurality of interior vertical interconnections that traverse at least one of the first, the second and the at least one additional thin substrates.

15. The integrated circuit structure of claim 8, wherein circuitry is formed on at least two of the first, the second and the at least one additional thin substrates, and wherein information processing is performed on data routed between the circuitry of at least two of the first, the second and the at least one additional thin substrates.

16. The integrated circuit structure of claim 8, wherein at least one of the first, the second and the at least one additional thin substrates comprises reconfiguration circuitry.

17. The integrated circuit structure of claim 8, wherein at least one of the first, the second, and the at least one additional thin substrates has logic circuitry formed thereon for performing at least one function from the group consisting of: virtual memory management, ECC, indirect addressing, content addressing, data compression, data decompression, graphics acceleration, audio encoding, audio decoding, video encoding, video decoding, voice recognition, handwriting recognition, power management and database processing.

18. The integrated circuit structure of claim 8, further comprising:
a memory array having a plurality of memory storage cells, a plurality of data lines, and a plurality of gate lines, wherein each memory storage cell stores a data value and has circuitry for coupling the data value to one of the plurality of data lines in response to receiving a gate control signal from one of the plurality of gate lines;
circuitry that generates the gate control signal in response to receiving an address, including means for mapping addresses to gate lines; and
a controller that determines if at least one of the plurality of memory cells is defective and alters said mapping to remove references to the one of the plurality of memory cells that is defective.

19. The integrated circuit structure of claim 8, further comprising:
at least one controller substrate having logic circuitry formed thereon;

at least one memory substrate having memory circuitry formed thereon;

a plurality of data lines and a plurality of gate lines on each memory substrate;

an array of memory cells on each memory substrate, wherein each memory cell stores a data value and has circuitry that couples the data value to one of the plurality of data lines in response to selecting one of the plurality of gate lines;

a gate line selection circuit that enables a gate line for a memory operation, wherein the gate line selection circuit comprises programmable gates for receiving address assignments for at least one gate line of the plurality of gate lines and wherein the address assignments are for determining which of the plurality of gate lines is selected for each address assignment; and controller substrate logic that determines if at least one memory cell of the array of memory cells is defective and alters the address assignments of the plurality of gate lines to remove references to the gate line that causes the defective memory cell to couple a data value to one of the plurality of data lines.

20. The integrated circuit structure of claim 19, wherein the controller substrate logic is configured to:

test the array of memory cells periodically to determine if at least one of the array of memory cells is defective; and remove references in the address assignments to gate lines that cause detected defective memory cells to couple data values to the plurality of data lines.

21. The integrated circuit structure of claim 19, further comprising:

programmable logic to prevent the use of data values from the plurality of data lines when gate lines cause detected defective memory cells to couple data values to the plurality of data lines.

22. The integrated circuit structure of claim 19, wherein the array of memory cells are arranged within physical space in a physical order and are arranged within an address space in a logical order and wherein the physical order of at least one memory cell is different than the logical order of the at least one memory cell.

23. The integrated circuit structure of claim 19, wherein:

the logic circuitry of the at least one controller substrate is tested by an external means; and the array of memory cells of the at least one memory substrate are tested by the logic circuitry of the at least one controller substrate, wherein the testing achieves a functional testing of a substantial portion of the array of memory cells.

24. The integrated circuit structure of claim 19, wherein the logic circuitry of the at least one controller substrate performs functional testing of a substantial portion of the array of memory cells.

25. The integrated circuit structure of claim 19, wherein the controller substrate logic is further configured to:

prevent the use of at least one defective gate line; and replace references to memory cells addressed using the defective gate line with references to spare memory cells addressed using a spare gate line.

26. The integrated circuit structure of claim 19, wherein the controller substrate logic is further configured to prevent the use of at least one defective gate line.

27. The integrated circuit structure of claim 19, wherein the logic circuitry of the at least one controller substrate can perform all functional testing of the array of memory cells of the at least one memory substrate.

28. The integrated circuit structure of claim 1, wherein the first substrate is a non-semiconductor material.

29. The integrated circuit structure of claim 1, wherein the first substrate and the second substrate are the same size or overlap each other completely.

30. The integrated circuit structure of claim 1, wherein at least one of the first and second substrates comprises a low stress dielectric layer, wherein the low stress dielectric layer is at least one of a silicon dioxide dielectric and an oxide of silicon dielectric and is caused to have a stress of about $5 \times 10^8$ dynes/cm$^2$ or less.

31. The integrated circuit structure of claim 1, further comprising memory circuitry on the second substrate, wherein a portion of the memory circuitry is redundant memory circuitry.

32. The integrated circuit structure of claim 1, wherein at least two of: the first substrate is a non-semiconductor material; at least one of said surfaces of the second substrate has formed thereon a dielectric with a stress of about $5 \times 10^8$ dynes/cm$^2$ or less; the dielectric is at least one of silicon dioxide and an oxide of silicon; the second substrate has one of logic circuitry and memory circuitry formed thereon; the second substrate has microprocessor circuitry formed thereon; the second substrate has reconfiguration circuitry formed thereon; the second substrate has redundant circuitry formed thereon; the second substrate has a thickness of about 1 to 8 microns; the second substrate has a thickness of about 10 microns or less; the first substrate and the second substrate are bonded by at least one diffusion bond; at least one of the substrates is substantially flexible; the second substrate is substantially flexible; at least one conductive path passes through the first substrate; at least one conductive path passes through the second substrate; at least one conductive path passes through the second substrate between the first surface and the second surface of the second substrate; at least one conductive path passes through the second substrate between interconnect contacts on the first surface and the second surface of the second substrate; conductive paths are formed between and within overlapping portions of bonded surfaces of the first substrate and second substrate: the second surface of the second substrate has an oxide layer formed thereon.

33. The integrated circuit structure of claim 1, wherein at least three of: the first substrate is a non-semiconductor material; at least one of said surfaces of the second substrate has formed thereon a dielectric with a stress of about $5 \times 10^8$ dynes/cm$^2$ or less; the dielectric is at least one of silicon dioxide and an oxide of silicon; the second substrate has one of logic circuitry and memory circuitry formed thereon; the second substrate has microprocessor circuitry formed thereon; the second substrate has reconfiguration circuitry formed thereon; the second substrate has redundant circuitry formed thereon; the second substrate has a thickness of about 1 to 8 microns; the second substrate has a thickness of about 10 microns or less; the first substrate and the second substrate are bonded by at least one diffusion bond; at least one of the substrates is substantially flexible; the second substrate is substantially flexible; at least one conductive path passes through the first substrate; at least one conductive path passes through the second substrate; at least one conductive path passes through the second substrate between the first surface and the second surface of the second substrate; at least one conductive path passes through the second substrate between interconnect contacts on the first surface and the second surface of the second substrate; conductive paths are formed between and within overlapping portions of bonded surfaces of the first substrate and second substrate; the second surface of the second substrate has an oxide layer formed thereon.

34. The integrated circuit structure of claim 1, wherein at least four of: the first substrate is a non-semiconductor material; at least one of said surfaces of the second substrate has formed thereon a dielectric with a stress of about $5\times10^8$ dynes/cm$^2$ or less; the dielectric is at least one of silicon dioxide and an oxide of silicon; the second substrate has one of logic circuitry and memory circuitry formed thereon; the second substrate has microprocessor circuitry formed thereon; the second substrate has reconfiguration circuitry formed thereon; the second substrate has redundant circuitry formed thereon; the second substrate has a thickness of about 1 to 8 microns; the second substrate has a thickness of about 10 microns or less; the first substrate and the second substrate are bonded by at least one diffusion bond; at least one of the substrates is substantially flexible; the second substrate is substantially flexible; at least one conductive path passes through the first substrate; at least one conductive path passes through the second substrate; at least one conductive path passes through the second substrate between the first surface and the second surface of the second substrate; at least one conductive path passes through the second substrate between interconnect contacts on the first surface and the second surface of the second substrate; conductive paths are formed between and within overlapping portions of bonded surfaces of the first substrate and second substrate: the second surface of the second substrate has an oxide layer formed thereon.

35. The integrated circuit structure of claim 1, wherein the second substrate has microprocessor circuitry formed thereon.

36. The integrated circuit structure of claim 1, wherein the first substrate and the second substrate are bonded by at least one diffusion bond.

37. The integrated circuit structure of claim 1, wherein the second substrate is substantially flexible.

38. The integrated circuit structure of claim 1, wherein at least one of the substrates is substantially flexible.

39. The integrated circuit structure of claim 1, wherein at least one conductive path passes through the first substrate.

40. The integrated circuit structure of claim 1, wherein at least one conductive path passes through the second substrate.

41. The integrated circuit structure of claim 1, wherein at least one conductive path passes through the second substrate between the first surface and the second surface of the second substrate.

42. The integrated circuit structure of claim 1, wherein at least one conductive path passes through the second substrate between interconnect contacts on the first surface and the second surface of the second substrate.

43. The integrated circuit structure of claim 1, wherein conductive paths are formed between and within overlapping portions of bonded surfaces of the first substrate and second substrate.

44. An integrated circuit structure comprising:
a first substrate having topside and bottomside surfaces, wherein the topside surface of the first substrate has interconnect contacts;
a second substrate having a thickness of about 50 microns or less and having topside and bottomside surfaces, wherein at least one of the topside surface and the bottomside surface of the second substrate has interconnect contacts, and wherein the bottomside surface of the second substrate is polished;
wherein a major portion of the topside surface of the first substrate and one of the topside surface of the second substrate and the bottomside surface of the second substrate are bonded in a stacked relationship; and
conductive paths between the interconnect contacts on the topside surface of the first substrate and said one of the topside surface of the second substrate and the bottomside surface of the second substrate, the conductive paths providing electrical connections between the first substrate and the second substrate;
wherein the first substrate overlaps at least a majority of the second substrates.

45. The integrated circuit structure of claim 44, wherein selected ones of said interconnect contacts of said topside surface of said first substrate are in electrical contact with selected ones of the interconnect contacts of said bottomside surface of said second substrate so as to form said electrical connections.

46. The integrated circuit structure of claim 44, wherein the first substrate and the second substrate are the same size or overlap each other completely.

47. The integrated circuit structure of claim 44, wherein at least one of the first and second substrates comprises a low stress dielectric layer, wherein the low stress dielectric layer is at least one of a silicon dioxide dielectric and an oxide of silicon dielectric and is caused to have a stress of about $5\times10^8$ dynes/cm$^2$ or less.

48. The integrated circuit structure of claim 44, further comprising memory circuitry on the second substrate, wherein a portion of the memory circuitry is redundant memory circuitry.

49. The integrated circuit structure of claim 44, wherein at least two of: the first substrate is a non-semiconductor material; at least one of said surfaces of the second substrate has formed thereon a dielectric with a stress of about $5\times10^8$ dynes/cm$^2$ or less; the dielectric is at least one of silicon dioxide and an oxide of silicon; the second substrate has one of logic circuitry and memory circuitry formed thereon; the second substrate has microprocessor circuitry formed thereon; the second substrate has reconfiguration circuitry formed thereon; the second substrate has redundant circuitry formed thereon; the second substrate has a thickness of about 1 to 8 microns; the second substrate has a thickness of about 10 microns or less; the first substrate and the second substrate are bonded by at least one diffusion bond; at least one of the substrates is substantially flexible; the second substrate is substantially flexible; at least one conductive path passes through the first substrate; at least one conductive path passes through the second substrate; at least one conductive path passes through the second substrate between the first surface and the second surface of the second substrate; at least one conductive path passes through the second substrate between interconnect contacts on the first surface and the second surface of the second substrate; conductive paths are formed between and within overlapping portions of bonded surfaces of the first substrate and second substrate; the bottomside surface of the second substrate has an oxide layer formed thereon.

50. The integrated circuit structure of claim 44, wherein at least three of: the first substrate is a non-semiconductor material; at least one of said surfaces of the second substrate has formed thereon a dielectric with a stress of about $5\times10^8$ dynes/cm$^2$ or less; the dielectric is at least one of silicon dioxide and an oxide of silicon; the second substrate has one of logic circuitry and memory circuitry formed thereon; the second substrate has microprocessor circuitry formed thereon; the second substrate has reconfiguration circuitry formed thereon; the second substrate has redundant circuitry formed thereon; the second substrate has a thickness of about 1 to 8 microns; the second substrate has a thickness of about 10 microns or less; the first substrate and the second substrate are bonded by at least one diffusion bond; at least one of the substrates is substantially flexible; the second substrate is substantially flexible; at least one conductive path passes through the first substrate; at least one conductive path passes through the second substrate; at least one conductive path passes through the second substrate between the first surface and the second surface of the second substrate; at least one conductive path passes through the second substrate between interconnect contacts on the first surface and the second surface of the second substrate; conductive paths are formed between and within overlapping portions of bonded surfaces of the first substrate and second substrate; the bottomside surface of the second substrate has an oxide layer formed thereon.

51. The integrated circuit structure of claim 44, wherein at least four of: the first substrate is a non-semiconductor material; the at least one of said surfaces of the second substrate has formed thereon a dielectric with a stress of about $5 \times 10^8$ dynes/cm$^2$ or less; the dielectric is at least one of silicon dioxide and an oxide of silicon; the second substrate has one of logic circuitry and memory circuitry formed thereon; the second substrate has microprocessor circuitry formed thereon; the second substrate has reconfiguration circuitry formed thereon; the second substrate has redundant circuitry formed thereon; the second substrate has a thickness of about 1 to 8 microns; the second substrate has a thickness of about 10 microns or less; the first substrate and the second substrate are bonded by at least one diffusion bond; at least one of the substrates is substantially flexible; the second substrate is substantially flexible; at least one conductive path passes through the first substrate; at least one conductive path passes through the second substrate; at least one conductive path passes through the second substrate between the first surface and the second surface of the second substrate; at least one conductive path passes through the second substrate between interconnect contacts on the first surface and the second surface of the second substrate; conductive paths are formed between and within overlapping portions of bonded surfaces of the first substrate and second substrate; the bottomside surface of the second substrate has an oxide layer formed thereon.

52. The integrated circuit structure of claim 44, wherein the first substrate is a non-semiconductor substrate.

53. The integrated circuit structure of claim 44, wherein the second substrate has microprocessor circuitry formed thereon.

54. The integrated circuit structure of claim 44, wherein the second substrate is one of a thin monocrystalline semiconductor substrate and a thin polycrystalline semiconductor substrate.

55. The integrated circuit structure of claim 44, wherein the circuitry formed on the second substrate is one of active circuitry and passive circuitry.

56. The integrated circuit structure of claim 44, wherein the circuitry formed on the second substrate comprises both active circuitry and passive circuitry.

57. The integrated circuit structure of claim 44, wherein the first substrate is a substrate having circuitry formed thereon.

58. The integrated circuit structure of claim 57, wherein the circuitry of the first substrate comprises one of active circuitry and passive circuitry.

59. The integrated circuit structure of claim 57, wherein the circuitry of the first substrate comprises both active circuitry and passive circuitry.

60. The integrated circuit structure of claim 44, wherein the first substrate and the second substrate are bonded by at least one diffusion bond.

61. The integrated circuit structure of claim 44, wherein at least one of the substrates is substantially flexible.

62. The integrated circuit structure of claim 44, wherein the second substrate is substantially flexible.

63. The integrated circuit structure of claim 44, wherein at least one conductive path passes through the first substrate.

64. The integrated circuit structure of claim 44, wherein at least one conductive path passes through the second substrate.

65. The integrated circuit structure of claim 44, wherein at least one conductive path passes through the second substrate between the topside surface and the bottomside surface of the second substrate.

66. The integrated circuit structure of claim 44, wherein at least one conductive path passes through the second substrate between interconnect contacts on the topside surface and the bottomside surface of the second substrate.

67. The integrated circuit structure of claim 44, wherein conductive paths are formed between and within overlapping portions of bonded surfaces of the first substrate and second substrate.

68. The integrated circuit structure of claim 44, further comprising:
    at least one additional thin substrate having circuitry formed thereon;
    a first of said at least one additional thin substrate being bonded to the second substrate and any additional thin substrates being bonded to a directly adjacent additional thin substrate; and
    conductive paths formed between said first of said at least one additional thin substrate and at least one of said first and second substrates and also between each additional thin substrate and at least one of said substrates of the integrated circuit structure.

69. The integrated circuit structure of claim 68, further comprising:
    at least one controller substrate having logic circuitry formed thereon;
    at least one memory substrate having memory circuitry formed thereon;
    a plurality of data lines and a plurality of gate lines on each memory substrate;
    an array of memory cells on each memory substrate, wherein each memory cell stores a data value and has circuitry that couples the data value to one of the plurality of data lines in response to selecting one of the plurality of gate lines;
    a gate line selection circuit that enables a gate line for a memory operation, wherein the gate line selection circuit comprises programmable gates for receiving address assignments for at least one gate line of the plurality of gate lines and wherein the address assignments are for determining which of the plurality of gate lines is selected for each address assignment; and
    controller substrate logic that determines if at least one memory cell of the array of memory cells is defective and alters the address assignments of the plurality of gate lines to remove references to the gate line that causes the defective memory cell to couple a data value to one of the plurality of data lines.

70. The integrated circuit structure of claim 69, wherein the controller substrate logic is configured to:
    test the array of memory cells periodically to determine if at least one of the array of memory cells is defective; and
    removes references in the address assignments to gate lines that cause detected defective memory cells to couple data values to the plurality of data lines.

71. The integrated circuit structure of claim 69, further comprising:
programmable logic to prevent the use of data values from the plurality of data lines when gate lines cause detected defective memory cells to couple data values to the plurality of data lines.

72. The integrated circuit structure of claim 69, wherein the array of memory cells are arranged within physical space in a physical order and are arranged within an address space in a logical order and wherein the physical order of at least one memory cell is different than the logical order of the at least one memory cell.

73. The integrated circuit structure of claim 69, wherein:
the logic circuitry of the at least one controller substrate is tested by an external means; and
the array of memory cells of the at least one memory substrate are tested by the logic circuitry of the at least one controller substrate, wherein the testing achieves a functional testing of a substantial portion of the array of memory cells.

74. The integrated circuit structure of claim 69, wherein the logic circuitry of the at least one controller substrate performs functional testing of a substantial portion of the array of memory cells.

75. The integrated circuit structure of claim 69, wherein the controller substrate logic is further configured to:
prevent the use of at least one defective gate line; and
replace references to memory cells addressed using the defective gate line with references to spare memory cells addressed using a spare gate line.

76. The integrated circuit structure of claim 69, wherein the controller substrate logic is further configured to prevent the use of at least one defective gate line.

77. The integrated circuit structure of claim 69, wherein the logic circuitry of the at least one controller substrate can perform all functional testing of the array of memory cells of the at least one memory substrate.

78. The integrated circuit structure of claim 68, wherein at least two of the first, the second and the at least one additional thin substrates are formed using different respective process technologies, wherein the different respective process technologies are selected from the group consisting of a DRAM process technology, a SRAM process technology, a FLASH process technology, an EPROM process technology, an EEPROM process technology, a Ferroelectric process technology and a Giant Magneto Resistance process technology.

79. The integrated circuit structure of claim 68, wherein at least one of the first, the second and the at least one additional thin substrates comprises a microprocessor.

80. The integrated circuit structure of claim 68, wherein:
at least one substrate of the first, the second and the at least one additional thin substrates has memory circuitry formed thereon; and
at least one substrate of the first, the second and the at least one additional thin substrates has logic circuitry formed thereon that performs tests on the at least one substrate that has memory circuitry formed thereon.

81. The integrated circuit structure of claim 68, wherein at least one substrate of the first, the second and the at least one additional thin substrates has memory circuitry formed thereon, the memory circuitry having a plurality of memory locations, wherein at least one memory location of the plurality of memory locations is used for sparing and wherein data from the at least one memory location on the at least one substrate having memory circuitry formed thereon is used instead of data from a defective memory location on the at least one substrate that has memory circuitry formed thereon.

82. The integrated circuit structure of claim 68, wherein:
at least one substrate of the first, the second and the at least one additional thin substrates has memory circuitry formed thereon; and
at least one substrate of the first, the second and the at least one additional thin substrates has logic circuitry formed thereon that performs programmable gate line address assignment with respect to the at least one substrate having memory circuitry formed thereon.

83. The integrated circuit structure of claim 68, further comprising a plurality of interior vertical interconnections that traverse at least one of the first, the second and the at least one additional thin substrates.

84. The integrated circuit structure of claim 68, wherein information processing is performed on data routed between the circuitry of at least two of the first, the second and the at least one additional thin substrates.

85. The integrated circuit structure of claim 68, wherein at least one of the first, the second and the at least one additional thin substrates comprises reconfiguration circuitry.

86. The integrated circuit structure of claim 68, wherein at least one of the first, the second, and the at least one additional thin substrates has logic circuitry formed thereon for performing at least one function from the group consisting of: virtual memory management, ECC, indirect addressing, content addressing, data compression, data decompression, graphics acceleration, audio encoding, audio decoding, video encoding, video decoding, voice recognition, handwriting recognition, power management and database processing.

87. The integrated circuit structure of claim 68, further comprising:
a memory array having a plurality of memory storage cells, a plurality of data lines, and a plurality of gate lines, wherein each memory storage cell stores a data value and has circuitry for coupling the data value to one of the plurality of data lines in response to receiving a gate control signal from one of the plurality of gate lines;
circuitry that generates the gate control signal in response to receiving an address, including means for mapping addresses to gate lines; and
a controller that determines if at least one of the plurality of memory cells is defective and alters said mapping to remove references to the one of the plurality of memory cells that is defective.

88. An integrated circuit structure comprising:
a first substrate having a first and second surface;
a second substrate having a first and second surface, wherein said second surfaces of the first and second substrates are opposite to said first surfaces;
wherein at least one of the first substrate and the second substrate has a thickness of about 50 microns or less, thereby providing at least one thin substrate, and wherein the second surface of the at least one thin substrate is polished;
wherein the first surface of the first substrate and a major portion of one of the first surface of the second substrate and the second surface of the second substrate are bonded in a stacked relationship by at least one bond, wherein the at least one bond secures a major portion of the second substrate to the first substrate; and
conductive paths between at least two of the first surface of the first substrate and the first and second surfaces of the second substrate, wherein the first substrate overlaps at least a majority of the second substrate.

89. The integrated circuit structure of claim 88, wherein the first substrate and the second substrate are the same size or overlap each other completely.

90. The integrated circuit structure of claim 88, wherein at least one of the first and second substrates comprises a low stress dielectric layer, wherein the low stress dielectric layer is at least one of a silicon dioxide dielectric and an oxide of silicon dielectric and is caused to have a stress of about $5 \times 10^8$ dynes/cm 2 or less.

91. The integrated circuit structure of claim 88, further comprising memory circuitry on the second substrate, wherein a portion of the memory circuitry is redundant memory circuitry.

92. The integrated circuit structure of claim 88, wherein at least two of: the first substrate is a non-semiconductor material; at least one of said surfaces of the second substrate has formed thereon a dielectric with a stress of about $5 \times 10^8$ dynes/cm$^2$ or less; the dielectric is at least one of silicon dioxide and an oxide of silicon; the second substrate has one of logic circuitry and memory circuitry formed thereon; the second substrate has microprocessor circuitry formed thereon; the second substrate has reconfiguration circuitry formed thereon; the second substrate has redundant circuitry formed thereon; the second substrate has a thickness of about 1 to 8 microns; the second substrate has a thickness of about 10 microns or less; the first substrate and the second substrate are bonded by at least one diffusion bond; at least one of the substrates is substantially flexible; the second substrate is substantially flexible; at least one conductive path passes through the first substrate; at least one conductive path passes through the second substrate; at least one conductive path passes through the first substrate between the first surface and the second surface of the first substrate; at least one conductive path passes through the second substrate between the first surface and the second surface of the second substrate; conductive paths are formed between and within overlapping portions of bonded surfaces of the first substrate and second substrate; the second surface of the second substrate has an oxide layer formed thereon.

93. The integrated circuit structure of claim 88, wherein at least three of: the first substrate is a non-semiconductor material; at least one of said surfaces of the second substrate has formed thereon a dielectric with a stress of about $5 \times 10^8$ dynes/cm$^2$ or less; the dielectric is at least one of silicon dioxide and an oxide of silicon; the second substrate has one of logic circuitry and memory circuitry formed thereon; the second substrate has microprocessor circuitry formed thereon; the second substrate has reconfiguration circuitry formed thereon; the second substrate has redundant circuitry formed thereon; the second substrate has a thickness of about 1 to 8 microns; the second substrate has a thickness of about 10 microns or less; the first substrate and the second substrate are bonded by at least one diffusion bond; at least one of the substrates is substantially flexible; the second substrate is substantially flexible; at least one conductive path passes through the first substrate; at least one conductive path passes through the second substrate; at least one conductive path passes through the first substrate between the first surface and the second surface of the first substrate; at least one conductive path passes through the second substrate between the first surface and the second surface of the second substrate; conductive paths are formed between and within overlapping portions of bonded surfaces of the first substrate and second substrate; the second surface of the second substrate has an oxide layer formed thereon.

94. The integrated circuit structure of claim 88, wherein at least four of: the first substrate is a non-semiconductor material; at least one of said surfaces of the second substrate has formed thereon a dielectric with a stress of about $5 \times 10^8$ dynes/cm$^2$ or less; the dielectric is at least one of silicon dioxide and an oxide of silicon; the second substrate has one of logic circuitry and memory circuitry formed thereon; the second substrate has microprocessor circuitry formed thereon; the second substrate has reconfiguration circuitry formed thereon; the second substrate has redundant circuitry formed thereon; the second substrate has a thickness of about 1 to 8 microns; the second substrate has a thickness of about 10 microns or less; the first substrate and the second substrate are bonded by at least one diffusion bond; at least one of the substrates is substantially flexible; the second substrate is substantially flexible; at least one conductive path passes through the first substrate; at least one conductive path passes through the second substrate; at least one conductive path passes through the first substrate between the first surface and the second surface of the first substrate; at least one conductive path passes through the second substrate between the first surface and the second surface of the second substrate; conductive paths are formed between and within overlapping portions of bonded surfaces of the first substrate and second substrate; the second surface of the second substrate has an oxide layer formed thereon.

95. The integrated circuit structure of claim 88, wherein the second substrate has microprocessor circuitry formed thereon.

96. The integrated circuit structure of claim 88, wherein the second substrate is one of a thin monocrystalline semiconductor substrate and a thin polycrystalline semiconductor substrate.

97. The integrated circuit structure of claim 88, wherein the circuitry formed on the second substrate is one of active circuitry and passive circuitry.

98. The integrated circuit structure of claim 88, wherein the circuitry formed on the second substrate comprises both active circuitry and passive circuitry.

99. The integrated circuit structure of claim 88, wherein the first substrate is a substrate having circuitry formed thereon.

100. The integrated circuit structure of claim 99, wherein the circuitry of the first substrate comprises one of active circuitry and passive circuitry.

101. The integrated circuit structure of claim 99, wherein the circuitry of the first substrate comprises both active circuitry and passive circuitry.

102. The integrated circuit structure of claim 88, further comprising:
   at least one additional thin substrate having circuitry formed thereon;
   a first of said at least one additional thin substrate being bonded to the second substrate and any additional thin substrates being bonded to a directly adjacent additional thin substrate; and
   conductive paths formed between said first of said at least one additional thin substrate and at least one of said first and second substrates and also between each additional thin substrate and at least one of said substrates of the integrated circuit structure.

103. The integrated circuit structure of claim 102, wherein at least two of the first, the second and the at least one additional thin substrates are formed using different respective process technologies, wherein the different respective process technologies are selected from the group consisting of a DRAM process technology, a SRAM process technology, a FLASH process technology, an EPROM process technology, an EEPROM process technology, a Ferroelectric process technology and a Giant Magneto Resistance process technology.

104. The integrated circuit structure of claim 102, wherein at least one of the first, the second and the at least one additional thin substrates comprises a microprocessor.

105. The integrated circuit structure of claim 102, wherein:
at least one substrate of the first, the second and the at least one additional thin substrates has memory circuitry formed thereon; and
at least one substrate of the first, the second and the at least one additional thin substrates has logic circuitry formed thereon that performs tests on the at least one substrate that has memory circuitry formed thereon.

106. The integrated circuit structure of claim 102, wherein at least one substrate of the first, the second and the at least one additional thin substrates has memory circuitry formed thereon, the memory circuitry having a plurality of memory locations, wherein at least one memory location of the plurality of memory locations is used for sparing and wherein data from the at least one memory location on the at least one substrate having memory circuitry formed thereon is used instead of data from a defective memory location on the at least one substrate that has memory circuitry formed thereon.

107. The integrated circuit structure of claim 102, wherein:
at least one substrate of the first, the second and the at least one additional thin substrates has memory circuitry formed thereon; and
at least one substrate of the first, the second and the at least one additional thin substrates has logic circuitry formed thereon that performs programmable gate line address assignment with respect to the at least one substrate having memory circuitry formed thereon.

108. The integrated circuit structure of claim 102, further comprising a plurality of interior vertical interconnections that traverse at least one of the first, the second and the at least one additional thin substrates.

109. The integrated circuit structure of claim 102, wherein information processing is performed on data routed between the circuitry of at least two of the first, the second and the at least one additional thin substrates.

110. The integrated circuit structure of claim 102, wherein at least one of the first, the second and the at least one additional thin substrates comprises reconfiguration circuitry.

111. The integrated circuit structure of claim 102, further comprising:
a memory array having a plurality of memory storage cells, a plurality of data lines, and a plurality of gate lines, wherein each memory storage cell stores a data value and comprises circuitry for coupling the data value to one of the plurality of data lines in response to receiving a gate control signal from one of the plurality of gate lines;
circuitry that generates the gate control signal in response to receiving an address, including means for mapping addresses to gate lines; and
a controller that determines if at least one of the plurality of memory cells is defective and alters said mapping to remove references to the one of the plurality of memory cells that is defective.

112. The integrated circuit structure of claim 102, further comprising:
at least one controller substrate having logic circuitry formed thereon;
at least one memory substrate having memory circuitry formed thereon;
a plurality of data lines and a plurality of gate lines on each memory substrate;
an array of memory cells on each memory substrate, wherein each memory cell stores a data value and comprises circuitry that couples the data value to one of the plurality of data lines in response to selecting one of the plurality of gate lines;
a gate line selection circuit that enables a gate line for a memory operation, wherein the gate line selection circuit has programmable gates for receiving address assignments for at least one gate line of the plurality of gate lines and wherein the address assignments are for determining which of the plurality of gate lines is selected for each address assignment; and
controller substrate logic that determines if at least one memory cell of the array of memory cells is defective and alters the address assignments of the plurality of gate lines to remove references to the gate line that causes the defective memory cell to couple a data value to one of the plurality of data lines.

113. The integrated circuit structure of claim 102, wherein at least one of the first, the second, and the at least one additional thin substrates has logic circuitry formed thereon for performing at least one function from the group consisting of: virtual memory management, ECC, indirect addressing, content addressing, data compression, data decompression, graphics acceleration, audio encoding, audio decoding, video encoding, video decoding, voice recognition, handwriting recognition, power management and database processing.

114. The integrated circuit structure of claim 113, wherein the controller substrate logic is configured to:
tests the array of memory cells periodically to determine if at least one of the array of memory cells is defective; and
removes references in the address assignments to gate lines that cause detected defective memory cells to couple data values to the plurality of data lines.

115. The integrated circuit structure of claim 113, further comprising:
programmable logic to prevent the use of data values from the plurality of data lines when gate lines cause detected defective memory cells to couple data values to the plurality of data lines.

116. The integrated circuit structure of claim 113, wherein the array of memory cells are arranged within physical space in a physical order and are arranged within an address space in a logical order and wherein the physical order of at least one memory cell is different than the logical order of the at least one memory cell.

117. The integrated circuit structure of claim 113, wherein:
the logic circuitry of the at least one controller substrate is tested by an external means; and
the array of memory cells of the at least one memory substrate are tested by the logic circuitry of the at least one controller substrate, wherein the testing achieves a functional testing of a substantial portion of the array of memory cells.

118. The integrated circuit structure of claim 113, wherein the logic circuitry of the at least one controller substrate performs functional testing of a substantial portion of the array of memory cells.

119. The integrated circuit structure of claim 113, wherein the controller substrate logic is further configured to:
prevent the use of at least one defective gate line; and
replace references to memory cells addressed using the defective gate line with references to spare memory cells addressed using a spare gate line.

120. The integrated circuit structure of claim 113, wherein the controller substrate logic is further configured to prevent the use of at least one defective gate line.

121. The integrated circuit structure of claim 113, wherein the logic circuitry of the at least one controller substrate can perform all functional testing of the array of memory cells of the at least one memory substrate.

122. The integrated circuit structure of claim 88, wherein the first substrate is a non-semiconductor material.

123. The integrated circuit structure of claim 88, wherein the first substrate and the second substrate are bonded by at least one diffusion bond.

124. The integrated circuit structure of claim 88, wherein at least one of the substrates is substantially flexible.

125. The integrated circuit structure of claim 88, wherein the second substrate is substantially flexible.

126. The integrated circuit structure of claim 88, wherein at least one conductive path passes through the first substrate.

127. The integrated circuit structure of claim 88, wherein at least one conductive path passes through the second substrate.

128. The integrated circuit structure of claim 88, wherein at least one conductive path passes through the first substrate between the first surface and the second surface of the first substrate.

129. The integrated circuit structure of claim 88, wherein at least one conductive path passes through the second substrate between the first surface and the second surface of the second substrate.

130. The integrated circuit structure of claim 88, wherein conductive paths are formed between and within overlapping portions of bonded surfaces of the first substrate and second substrate.

* * * * *